United States Patent
Sharma et al.

(10) Patent No.: US 7,288,469 B2
(45) Date of Patent: Oct. 30, 2007

(54) METHODS AND APPARATUSES FOR FORMING AN ARTICLE

(75) Inventors: Ravi Sharma, Fairport, NY (US); Ronald M. Wexler, Rochester, NY (US); Jason A. Payne, Rochester, NY (US); Gilbert A. Hawkins, Mendon, NY (US)

(73) Assignee: Eastman Kodak Company, Rochester, NY (US)

( * ) Notice: Subject to any disclaimer, the term of this patent is extended or adjusted under 35 U.S.C. 154(b) by 320 days.

(21) Appl. No.: 11/003,822

(22) Filed: Dec. 3, 2004

(65) Prior Publication Data

US 2006/0119669 A1 Jun. 8, 2006

(51) Int. Cl.
*H01L 21/20* (2006.01)

(52) U.S. Cl. .................. 438/584; 347/77; 257/E21.001

(58) Field of Classification Search ...................... None
See application file for complete search history.

(56) References Cited

U.S. PATENT DOCUMENTS

| | | | |
|---|---|---|---|
| 1,941,001 | A | 12/1933 | Hansell |
| 3,373,437 | A | 3/1968 | Sweet et al. |
| 3,709,432 | A | 1/1973 | Robertson |
| 4,350,986 | A | 9/1982 | Yamada |
| 4,670,761 | A | 6/1987 | Yoshino et al. |
| 5,224,843 | A | 7/1993 | van Lintel |
| 5,976,284 | A | 11/1999 | Calvert et al. |
| 6,081,196 | A | 6/2000 | Young |
| 6,194,837 | B1 | 2/2001 | Ozawa |
| 6,213,595 | B1 | 4/2001 | Anagnostopoulos et al. |
| 6,373,453 | B1 | 4/2002 | Yudasaka |
| 6,474,795 | B1 | 11/2002 | Lebens et al. |
| 6,491,362 | B1 | 12/2002 | Jeanmaire |
| 6,503,831 | B2 | 1/2003 | Speakman |
| 6,508,543 | B2 | 1/2003 | Hawkins et al. |
| 6,517,197 | B2 | 2/2003 | Hawkins et al. |
| 6,545,424 | B2 | 4/2003 | Ozawa |

(Continued)

FOREIGN PATENT DOCUMENTS

EP 0 615 256 B1 9/1998

(Continued)

OTHER PUBLICATIONS

Edward Cohen & Edgar Gutoff, *Modern Coating and Drying Technology*, published by John Wiley & Sons, Inc., 1992.

*Primary Examiner*—Scott B. Geyer

(57) ABSTRACT

Methods and apparatuses are provided for depositing a material on a surface. In accordance with the method a stream of a component material is formed having formed printing and non-printing droplets and satellite droplets of the material. The stream is directed at the surface. A deflecting energy is applied to separate printing droplets from non-printing droplets in the stream, so that only printing droplets travel to the surface. The deflecting energy is adapted to direct non-printing droplets for non-printing drop collection, and to direct at least a portion of the satellite droplets to be controlled in a manner adapted to prevent the material in the satellite droplets from reaching the surface, so that less than all of the material in the satellite droplets reaches the surface. Articles are also provided having limited satellite material.

75 Claims, 17 Drawing Sheets

U.S. PATENT DOCUMENTS

| | | |
|---|---|---|
| 6,555,968 B2 | 4/2003 | Yamazaki et al. |
| 6,572,222 B2 | 6/2003 | Hawkins et al. |
| 6,575,566 B1 | 6/2003 | Jeanmaire et al. |
| 6,588,888 B2 | 7/2003 | Jeanmaire et al. |
| 6,642,651 B2 | 11/2003 | Yudasaka |
| 6,695,440 B2 | 2/2004 | Lebens et al. |
| 2003/0174190 A1 | 9/2003 | Jeanmaire |
| 2003/0202054 A1 | 10/2003 | Jeanmaire et al. |
| 2004/0053431 A1 | 3/2004 | Chang et al. |

FOREIGN PATENT DOCUMENTS

| | | |
|---|---|---|
| EP | 1 079 397 A1 | 2/2001 |
| EP | 1 277 578 A2 | 1/2003 |
| EP | 1 319 513 A2 | 6/2003 |
| EP | 1 452 314 A1 | 9/2004 |
| WO | WO97/18944 | 5/1997 |
| WO | WO 00/63943 | 10/2000 |
| WO | WO 00/65887 | 11/2000 |

METHODS AND APPARATUSES FOR FORMING AN ARTICLE

FIELD OF THE INVENTION

This invention generally relates to a method for forming two and three-dimensional structures using ink jet printing mechanisms and more particularly relates to improved methods and apparatus for web-based fabrication of electronic or optical devices using material deposition from a continuous stream of printing droplets.

BACKGROUND OF THE INVENTION

It is recognized that high-speed manufacture helps to drive down the cost of a broad range of products ranging from consumable items and materials to electronic and optical components. Web-based fabrication, conventionally used for making photographic film and related sensitized materials, is particularly advantaged for high-speed manufacture of products formed on flexible substrates. Thus, methods that utilize web-based fabrication enable more economical manufacturing solutions for existing products and enable the development of new products on flexible substrates.

One area of particular interest for high-speed, web-based manufacture relates to the fabrication of electronic or optical devices on flexible substrates. Methods for device fabrication would form the component elements of such electronic or optical devices by depositing patterned layers of material, in liquid droplet form, onto a substrate. In web-based printing, a flexible medium, typically provided in roll or cut sheet form, is fed to the printing mechanism and is moved through the printing mechanism during application of inks or other materials. In concept, web-based fabrication would adapt this printing model for manufacturing electronic and other devices on a flexible support or substrate. In order to fabricate electronic or optical devices commercially onto a moving flexible substrate using liquid droplet deposition, the following requirements are of special importance:

(i) High resolution (dots per inch). The capability for fine detail needed to form layers within an electronic component places high demands on droplet resolution, that is, on spatially compact and accurate placement of droplets. Although high-resolution can be achieved by executing multiple passes of the receiving surface past a printing mechanism, it would be highly preferable to deposit all droplets of a single fluid from the same droplet forming or droplet ejection station in one pass to form a structure. This cannot be done with conventional drop on demand ink jet technology because such technology cannot apply liquids with laydown densities sufficient to form many desirable structural features in a single pass. Accordingly, multiple passes are required to form such structures using conventional droplet demand ink to technology. This creates the potential for registration errors which can affect the quality of the formed structure. Further, such an approach creates striations within the formed structure that can alter the performance capabilities of the structure. For example, in FIG. 1A, a cross-section view of a structure 3 is shown that is formed using such prior art technologies. As is shown in FIG. 1A, a first layer 4 of structure 3 is formed on a substrate 2 in a first printing pass. Similarly, second layer 5 is applied to first layer 4 in a second pass, while a third layer 6 is applied in a third pass. It will be appreciated that the nature of and quality of the material boundaries between first layer 4, second layer 5, and third layer 6 limits the functional capabilities of structure 3 so formed. For example these boundaries, referred to herein as striations can alter the conductance of structure 3, the mechanical strength of structure 3, the thermal management capability to the structure 3 or other desirable properties of structure 3. Accordingly, what is desired is a system that is capable of forming structures comprising a relatively large feature height but with a minimum number of striations. Undesirable artifacts may be visible in a top view as shown in FIG. 1C, which is a top view the structure illustrated in section in FIG. 1A. Such artifacts can be caused by deposition of discrete drops too widely separated in time which, in turn, causes registration problems.

(ii) Dependable delivery of fluid droplets at the needed volume and flow rate, without interruption. Related both to resolution and to yield percentages for a continuously moving substrate, this requirement concerns the overall speed, reliability, and robustness of the droplet-forming mechanism itself. Since web fabrication uses a continuously moving substrate, there is no opportunity to rescan an area of the substrate to ensure droplet delivery once the substrate has moved past the droplet-ejection station. In a single pass, it would be preferable to be able to form a feature on a surface where the height of the feature is relatively large. The relative height of a feature can be best expressed in terms of a height:width ratio for the feature, as formed by the droplet ejection mechanism in a single pass. A height:width ratio of at least 0.20 must be achievable with the substrate traveling at a rate of speed exceeding a few inches per second.

(iii) Highly accurate droplet positioning. Also related to resolution and yield, the positional accuracy of the droplet-ejection mechanism must allow droplet placement accuracy preferably within +/−2 microns. For a straight line feature extending in any direction along the flexible substrate, height of the feature should be controllable to within about 1% RMS. Width should be controllable to within about 1% RMS.

(iv) Precision control of droplet volume. Similarly related to resolution and yield, the stringent requirement for droplet volume control assures that precisely the correct amount of fluidic material is deposited at each location on the flexible substrate surface. For electronic component fabrication, droplet volumes would range from about 3 to about 40 picoliters, with volume controlled to within about +/−1% or better. The capability to change droplet volume and maintain this tight level of control would be particularly advantageous for component fabrication.

(v) Flexibility for droplet treatment, in flight and on impact. For some types of fluid materials, it may be advantageous to provide some type of conditioning treatment, such as to obtain proper adhesion, for example, or to prevent or facilitate rapid drying. This function can be most easily achieved where the distance allowable between the droplet ejection mechanism and the substrate surface is somewhat flexible. For a broad range of applications, it would be advantageous to allow a gap between the ejection point of a liquid droplet and the substrate surface.

(vi) Capability to handle a range of fluid viscosities. The many types of fluids that must be deposited for forming electronic components and other complex devices span a wide range of viscosities. High-viscosity fluids, in particular, such as those with a low shear in excess of 10 cP, can prove difficult to deposit accurately in droplet form. A number of fluid materials with advantageous properties for forming electronic devices have low shear viscosities in excess of 100 cP, well beyond the range of conventional droplet deposition devices. One problem inherent to droplet-based delivery of high viscosity fluids relates to undesirable satellite droplets that form as a result of droplet formation. Generally tinier than printing droplets, satellite droplets form due to the complex rheology of these substances.

FIG. 1B shows a top view of a substrate 2 having intentionally printed drops 7 of material adjacent to each other with undesirable satellite drops 8 and 9 in the vicinity of the intentionally printed drops 7. Such satellite drops can have a number of undesirable effects on the structure formed on substrate 2. For example, as is shown in FIG. 1B, satellite drop 8 is positioned proximate to one of the intentionally printed drops 7 so as to effectively alter the shape thereof. As is also shown in FIG. 1B, satellite drops 9 are positioned between intentionally printed drops 7 and can, in certain embodiments, provide an undesirable electrical short therebetween or create other unintentional effects.

(vii) Adaptability to a range of fluid characteristics. In addition to viscosity, there are a number of other fluid properties that present special challenges for deposition onto a flexible substrate in droplet form. Volatile and other heat-sensitive fluids must be carefully handled and may not be suitable for droplet ejection methods that employ high heat levels. Highly viscous polymers can be particularly sensitive to high heat levels. Fluids that exhibit electroluminescence must also be protected from high heat conditions. The droplet formation and ejection mechanisms would ideally be capable of depositing both conductive and non-conductive fluids. It would be advantageous to be able to form and eject fluid droplets containing colloids and particulates, including fluids containing suspended nanoparticles. In addition, it would be beneficial to be able to adapt the deposition mechanism to the rheology of the deposited fluid, rather than being constrained by inherent limitations of the fluid delivery technology.

(viii) Suitable surface preparation. The method adapted for fluid deposition must be compatible with various types of surface preparation techniques for improved droplet adhesion, spread, and related characteristics.

Conformance to the above-listed requirements is well beyond the capabilities of conventional methods for droplet deposition. The ability to meet or exceed these requirements would enable web-based fabrication with increasingly faster throughput, possibly allowing web media transport speeds in excess of 1000 feet per minute for some types of applications and components.

Conventional techniques for the fabrication of electronic and electro-optical devices typically involve a number of different processes for forming various layers that make up the device, including photolithography, oxidation, etching, and masking, for example. Techniques for depositing materials in a droplet or vaporized form to build surface features include vacuum or vapor deposition, sputtering, and droplet deposition using spray bar apparatus. Often, multiple processes are used in combination, requiring transfer of a substrate between various types of equipment and involving careful handling of the product in its intermediate fabrication stages. Because of this, the complex processing sequence that is currently required for fabrication of a display device or for a support electronic component such as a field effect transistor is time-consuming, trouble-prone, and costly. As the number of processing steps increases, the technical challenges for integration of components on a flexible substrate become even more demanding, throughput slows, the likelihood of contamination increases, and yields can be dramatically reduced.

Attempts to improve conventional fabrication techniques and achieve more satisfactory yields have included use of drop-on-demand ink jet print heads for deposition of at least some layers of electronic or optical components, as is disclosed, for example, in U.S. Pat. No. 6,503,831 to Speakman; U.S. Pat. Nos. 6,194,837 and 6,545,424 to Ozawa; U.S. Pat. Nos. 6,373,453 and 6,642,651 to Yudasaka; U.S. Pat. No. 6,555,968 to Yamazaki et al.; and U.S. Pat. No. 6,087,196 to Sturm et al.

In operation, "drop-on-demand" ink jet printing provides fluid droplets for impact upon a recording surface using a localized pressurization actuator (thermal, piezoelectric, air pressure, etc.) at each nozzle. Selective activation of the actuator causes the formation and ejection of a droplet from a corresponding nozzle. The droplet crosses the space between the print head nozzle and the print substrate and strikes the print substrate. The formation of printed images, for example, is achieved by controlling the individual formation of ink droplets, as is required to create the desired image. With thermal actuators, a heater for each nozzle, located at a convenient location, heats the fluid within a chamber, causing a quantity of the fluid to change phase and to form a gaseous steam bubble. This momentarily increases the internal fluid pressure sufficiently for a fluid droplet to be expelled. The bubble then collapses as the heating element cools, and the resulting vacuum draws fluid into the chamber from a reservoir to replace fluid that was ejected from the nozzle. Alternately, piezoelectric actuators, such as that disclosed in U.S. Pat. No. 5,224,843 to vanLintel, have a piezoelectric crystal in a fluid channel that flexes when an electric current flows through it, forcing a fluid droplet out of a nozzle.

In conventional thin-film fabrication methods, such as those used in commercially available drop-on-demand ink jet printers, a sheet of substrate is held stationary during materials deposition. One or more print heads or other printing mechanisms are then passed over the stationary substrate, one or more times, in order to deposit the various component layers with sufficient resolution to form the electronic device. Once deposition of these materials is complete, the sheet of substrate can be lifted from place and made available for any further processing.

However, while drop-on-demand ink jet print mechanisms have been adapted for depositing some types of materials onto a substrate, there are significant drawbacks and performance thresholds, inherent to drop-on-demand technology, that limit its usefulness for web-based fabrication of electronic and related components, in which the substrate is continuously moving. The resolution limitations of drop-on-demand printers are a function of the droplet formation and delivery, componentry design, with a separate heater or piezoelectric actuator required for each individual nozzle. Characteristically, drop-on-demand printers improve their inherently low resolution by making a series of repeated passes over the same area of a substrate. The use of repeated passes, however, would not be well-suited to a web manufacturing environment with a continuously moving substrate. In addition, layering of the same material onto itself in successive passes is not optimal for obtaining homogeneous density. For most deposited materials, striations develop at the interface between successively printed layers, which is undesirable in many applications, for example in the deposition of Organic Light Emitting Diode (OLED) or Polymeric Light Emitting Diode (PLED) materials.

Droplet volume control is typically well above +/−5% at best, a limitation that is further compounded by tendency of nozzles to clog or to form and eject unwanted satellite droplets. There is no known method for compensating for the formation of satellite droplets that can deposit material improperly, compromising component operation or even causing component failure. Satellite droplets are commonly observed with drop-on-demand print devices, particularly where fluids deposited exceed viscosities of about 3 cP. The viscosity range of drop-on-demand printers is very limited; high viscosity fluids can exhibit low-shear viscosities well out of range of accurate droplet formation and delivery for these devices. Because many types of drop-on-demand print heads employ pulsed heat for forming and ejecting droplets, there are also limitations on the types of fluids that can be accurately delivered without being damaged or introducing safety problems. Requiring a close proximity between the nozzle and receiving substrate, the drop-on-demand print head is relatively inflexible for allowing supporting droplet conditioning mechanisms to be used. Drop-on-demand print mechanisms cannot be scaled, beyond a narrow range, to suit the rheology of the fluid to be deposited; instead, the fluid must be adapted to the fairly limited geometry of the drop-on-demand droplet forming mechanism.

To counter some of the inherent limitations of this technology, some types of drop-on-demand solutions use a wax carrier into which a colorant or dye is mixed. For this type of print technology, the wax carrier remains as part of the deposited material. While this may be acceptable for some types of color printing, it can be readily appreciated that the retention of a wax carrier would prevent component fabrication in most cases. Finally, while the quality of patterns formed using drop-on-demand ink jet techniques can be acceptable at lower throughput rates where the substrate can be held stationary, the demands of web fabrication at high rates of speed easily exceed the capabilities of drop-on-demand technology and restrict the types of components that can be fabricated or require combination with other types of deposition methods to supplement the droplet formation provided from the print head.

Recognizing the shortcomings of conventional inkjet printing for component fabrication, a number of hybrid methods have been proposed. These include methods disclosed in the Ozawa '837 and '424 patents cited above, in which, for a device comprising multiple layers of material, some of the component layers are deposited using drop-on-demand ink jet printing and other layers are deposited using vacuum deposition or other methods, including conventional use of masks and photochemical etching, as is described in International Application WO 97/18944 by Calvert et al.; European Patent EP 0 615 256 to Mutsaers et al.; European Patent Application EP 1 079 397 to Cloots et al.; and U.S. Pat. No. 5,976,284 to Calvert et al. However, it can be appreciated that such hybrid methods are not particularly conducive to high-speed web-based fabrication and add cost and complexity to the fabrication process. As is true with conventional photo-etching schemes, the substrate itself must be maintained in place during the deposition process, effectively precluding any type of web-based fabrication. Given the constraints inherent to conventional drop-on-demand ink jet print apparatus, it would be difficult to further extend the use of drop-on-demand ink jet masking technology for forming conductive patterns of higher complexity and high resolution and to obtain the economies of high-speed production afforded by web-based fabrication.

Increasing demand for economical, high-speed methods of fabrication for electronic, electro-optical, or optical devices, particularly for Organic Light Emitting Diodes (OLED) and Polymeric Light Emitting Diodes (PLED) sometimes known as solution processable organic light emitting diode display components, points to the need for improvements over the conventional fabrication methods that have been commercialized to date. Thus, it can be seen that there is a need for an improved method and apparatus for forming two- and three-dimensional structures on flexible substrates using web-based fabrication techniques, in which the substrate is continuously moving in a travel direction.

SUMMARY OF THE INVENTION

Methods and apparatuses are provided for depositing a material on a surface. In accordance with one embodiment of the method a stream of a component material is formed having formed printing and non-printing droplets and satellite droplets of the material. The stream is directed at the surface. A deflecting energy is applied to separate printing droplets from non-printing droplets in the stream, so that only printing droplets travel to the surface. The deflecting energy is adapted to direct non-printing droplets for non-printing drop collection, and to direct at least a portion of the satellite droplets to be controlled in a manner adapted to prevent the material in the satellite droplets from reaching the surface, so that less than all of the material in the satellite droplets reaches the surface. Articles are also provided having limited satellite material.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

Continuous ink jet print heads have been used in a number of different types of large format, high-quality color printing apparatus. The continuous ink jet printing technology itself is not new. U.S. Pat. No. 1,941,001, issued to Hansell on Dec. 26, 1933, and U.S. Pat. No. 3,373,437, issued to Sweet et al. on Mar. 12, 1968, each disclose printing apparatus using an array of ink jet nozzles wherein ink droplets to be printed are selectively charged and deflected towards a recording medium. This early droplet steering technique described in the '001 (Hansell) and '437 (Sweet et al.) patents is known as binary deflection continuous ink jet. Unlike drop-on-demand devices, continuous ink jet printers operate by generating a continuous sequence of ink droplets in a stream directed toward the receiving surface and selectively steering individual ink droplets along either of two trajectories: droplets along one trajectory are directed onto the recording surface for imaging; droplets along the other trajectory are non-printing droplets, diverted from the surface and typically recycled.

A continuous ink jet printer forms the droplet stream using a pressurized ink source that is separate from the nozzle assembly itself. A number of different types of droplet steering mechanisms have been developed for these devices. Conventional continuous ink jet printers steer droplets from the droplet stream utilizing electrostatic charging devices that are placed close to the point where a filament of ink from a nozzle breaks into individual ink droplets. The ink droplets are electrically charged and are then directed along the appropriate trajectory using deflection electrodes. When no printing droplet is needed, the ink droplets are directed along the waste trajectory into an ink-capturing mechanism (often referred to as a catcher, interceptor, or gutter). When a print droplet is desired, the ink droplet is directed along the print trajectory, substantially normal to the receiving surface of a recording medium, to strike the recording medium at a specific location.

Printing Apparatus Using Continuous Ink Jet Print Head

Figure 2A:
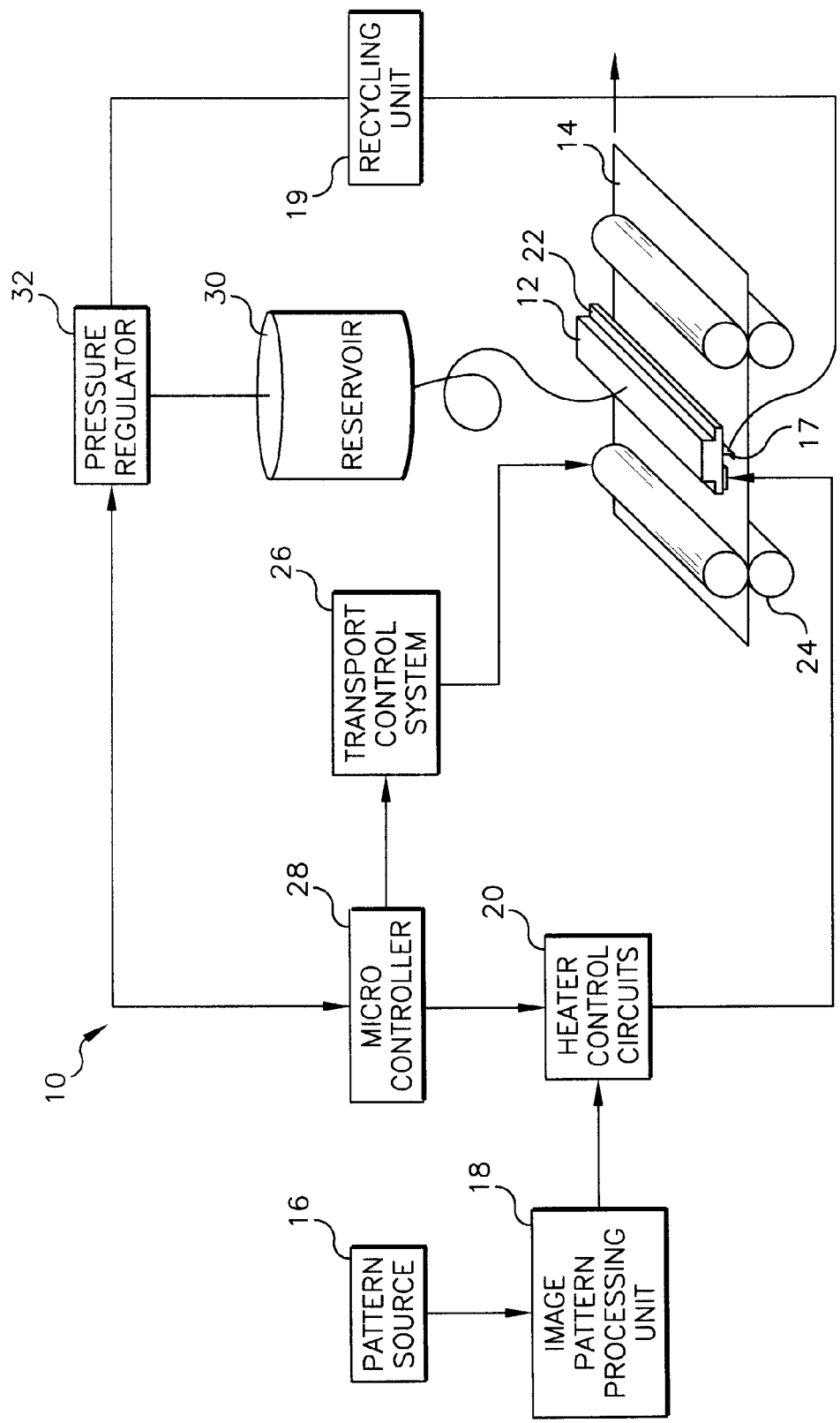
FIG. 2A is a perspective block diagram view of an existing apparatus for printing using a continuous ink jet print head.
Figure 2B:
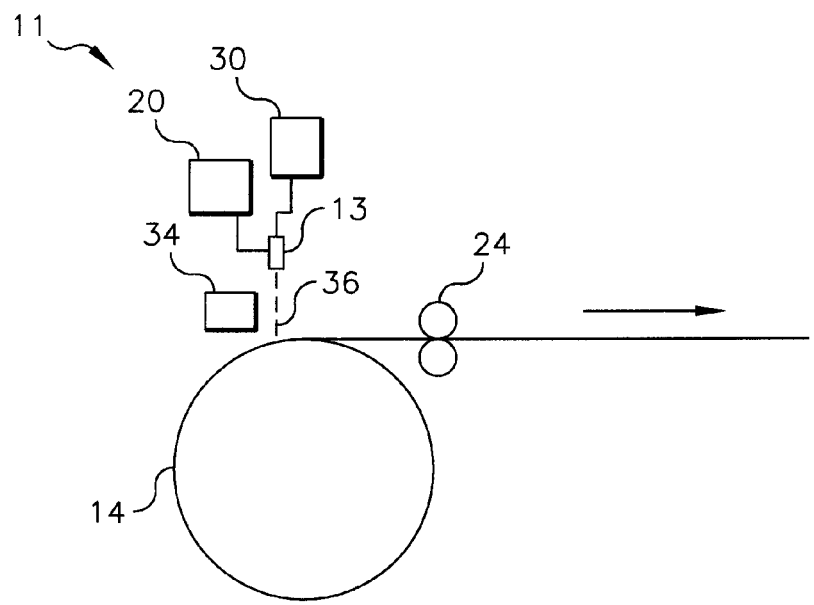
FIG. 2B is a side view schematic block diagram showing a web fabrication apparatus using a continuous ink jet print head adapted according to the present invention.

Referring to the block diagram of FIG. 2A, there is shown an embodiment of a print apparatus 10 using a continuous ink jet print head 12 for depositing ink onto a print support 14. In one embodiment, support 14 is provided on a moving web; however, only that portion of print support 14 in the vicinity of continuous ink jet print head 12 is represented in FIGS. 2A and 2B. Referring to FIG. 2A, printing apparatus 10 includes a pattern source 16 such as a scanner or computer which provides digital image pattern data for forming a pattern of ink onto support 14. This image data is converted to droplet pattern data by an image pattern processing unit 18 which also stores the image data in memory. A plurality of heater control circuits 20 read data from the image memory and apply time-varying electrical pulses to a set of nozzle heaters 22 that are part of continuous ink jet print head 12. These pulses are applied at an appropriate time, and to the appropriate nozzle, so that drops formed in the droplet stream are deposited onto support 14 in the appropriate position designated by the image data in memory, thereby forming the printed image.

As indicated by the directional arrow in FIG. 2A, support 14 is moved in a travel direction relative to print head 12 by support transport system 24, which is electronically controlled by a transport control system 26, and which in turn is controlled by a micro-controller 28. Support transport system 24 shown in FIG. 2A is a schematic representation only, and many different mechanical configurations are possible. For example, a combination of drive rollers and intermediate transfer rollers could be used to facilitate transport of support 14. An intermediate transfer roller or other conventional coating methods could be used to apply a material treatment onto support 14 for conditioning the surface prior to or following deposition by continuous ink jet print head 12, using techniques well known in the ink jet imaging arts. A range of media transport speeds is possible, depending on factors such as materials deposited, support type and surface treatment, and media width.

Referring again to FIG. 2A, the deposited ink is provided from a fluid reservoir 30, under pressure. In the non-printing state, droplets are unable to reach support 14 due to a fluid gutter 17 that blocks the stream and which typically allows a portion of the ink to be recycled by a fluid recycling unit 19. Fluid recycling unit 19 reconditions the ink and feeds it back to fluid reservoir 30, using techniques well known in the art. The ink fluid pressure suitable for optimal operation depends on a number of factors, including geometry and thermal properties of the nozzles and viscosity and thermal properties of the ink. A constant fluid pressure can be achieved by applying pressure to fluid reservoir 30 under the control of fluid pressure regulator 32.

The fluid ink is distributed to the back surface of print head 12 and preferably flows through slots and/or holes etched through a silicon support of continuous ink jet print head 12 to its front surface, where a plurality of nozzles and heaters are situated. With continuous ink jet print head 12 fabricated from silicon, it is possible to integrate heater control circuits 20 with the print head.

Typically, continuous ink jet printing devices shown in FIGS. 2A and 2B are capable of faster printing than are drop-on-demand ink jet printing devices and are preferred where higher quality printed images and graphics are needed. However, for reasons described below, continuous ink jet printing devices have not been widely used for applications other than high-value color printing and prepress environments.

The potential of continuous ink jet printing technology has not been tapped for fabrication of electronic or optical components and for forming other 2-D and 3-D structures on a support for a number of reasons. In general, continuous ink jet printers can be more complex than drop-on-demand printers, since each fluid that is printed requires an individual droplet formation, deflection, and waste capturing system. Because conventional continuous ink jet printers utilize electrostatic charge for droplet deflection, these devices would not provide a suitable mechanism for depositing fluids that are insulators, for example. Moreover, requirements for waste fluid recycling and management, problems with the overall availability of print heads using this alternative technology, and unfamiliarity with the requirements and control of this alternative technology appear to have discouraged researchers from employing continuous ink jet methods for fabrication of OLED, PLED, and other electronic and optical devices.

Figure 3:
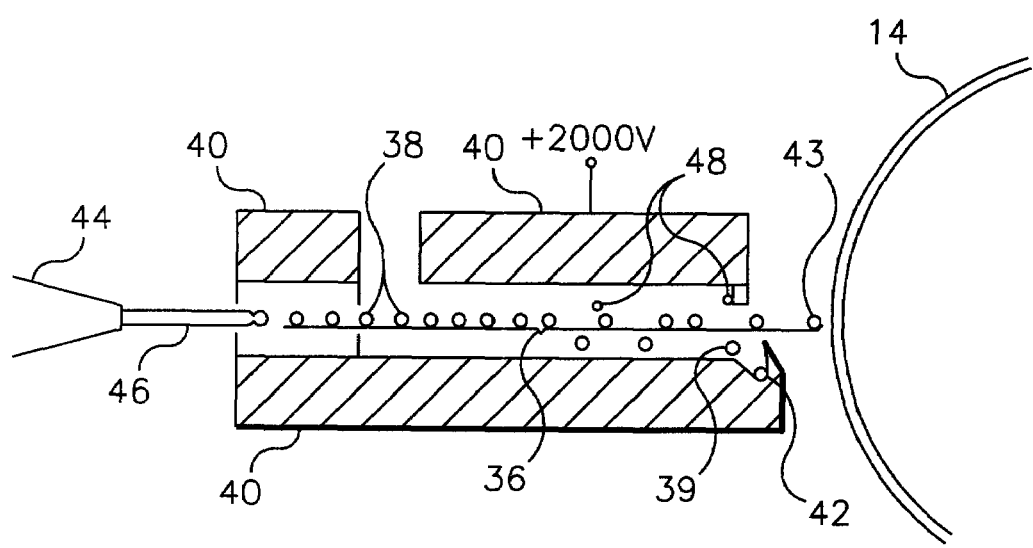
Referring to FIG. 3, there is shown a nozzle of a continuous ink jet print head with electrodes that provide electrostatic deflection of droplets in a stream.

Conventional continuous flow print head technology employs electrostatic forces for droplet steering, providing selective deflection of droplets in the stream emitted from each nozzle. Referring to FIG. 3, there is shown a nozzle 44 of a continuous ink jet print head 12 with electrodes 40 that provide electrostatic deflection of droplets 38 in stream 36. Nozzle 44 emits a flow 46 that breaks into a succession of droplets 38, with droplets 38 following each other in rapid succession. A gutter 42 acts as a type of receiving area, collecting deflected droplets 39 by electrodes 40; undeflected droplets 43 are deposited on support 14. It must be observed that either the deflected droplets or the undeflected droplets 43 can be deposited, depending on the configuration of print head 12.

A potential advantage of continuous ink jet printing relates to the capability for precision control of fluid droplet volume. Methods for selective droplet deposition from a continuous stream of droplets allow control of droplet size to well within +/−1.0% nozzle-to-nozzle with most fluids. This added control is one factor that allows continuous ink jet printing, for example, to enjoy higher resolution and more accurate droplet placement than is available using alternative types of droplet-ejection devices.

Yet another potential advantage of using selective droplet deposition from a continuous stream of droplets is that the nozzle-to-support distance is substantially larger than is available for drop-on-demand ink jet or other types of deposition methods. Because fluid pressure is provided separately from the nozzle array, the continuous stream nozzle can be greater than a few millimeters from the support surface for most fluids. This allows space for droplet or surface conditioning immediately before, during, or immediately following droplet travel. This also makes it possible for multiple nozzle structures to be directed toward the same point or line along the support, allowing a greater range of fluid volumes to be deposited.

The droplet frequency formed by selective droplet deposition from a continuous stream of droplets can be several times that of conventional drop-on-demand print heads or of other droplet deposition mechanisms. This inherent high droplet formation frequency not only allows multiple print nozzles to be directed toward the same point on the support, but also allows multiple drops to be overlaid before any significant drying or curing occurs, thereby minimizing undesirable striations in a deposited feature. This advantage can be particularly contrasted with drop-on-demand and other droplet deposition methods, where there are multiple passes required to obtain sufficient depth of material, resulting in striations at the interfaces between layers.

The employment of selective droplet deposition from a continuous stream of droplets allows the use of a number of different possible diluent carrier fluids into which the deposited material is mixed. Types of diluent carriers available include organic solvents, for example. Unlike waxes used with phase change drop-on-demand print mechanisms, the carrier used for continuous stream droplet deposition can be dried once the droplet is deposited. Only trace amounts (for example, less than 1% by volume) of the carrier would remain once the droplet is dried.

Although conventional electrostatic continuous flow ink jet technology has advantages for printing color inks, there are some inherent shortcomings of this technology that constrain its adaptation for use in fabricating components. As one drawback, the conductivity range for materials ejected from continuous ink jet print heads using electrostatic deflection is typically from about 500 to about 2,000 microsiemens/cm. This limits the usability of electrostatic deflection methods for non-conductive materials and prevents the use of this technology for depositing insulators within a component or circuit. Further, the combination of electrostatic deflection and acoustic stimulation as is known in the art is capable only over a limited viscosity range. Most color inks deposited using this technology have Newtonian viscosities within 1-2 cP. However, many of the liquid materials needed for component fabrication have much higher viscosities, many in excess of 10 cP, some that show shear thinning rheologies.

A further problem with electrostatic deflection from the continuous stream of droplets relates to satellite droplets. FIG. 3 shows droplets 38 in stream 36, directed toward the surface of support 14, where deflected droplets 39 travel away from the printing path. Satellite droplets 48, typically tinier than droplets 38 and typically not synchronous with the timing of successive droplets 38, tend to collect on structures of electrodes 40, eventually causing clogging or shorting if nozzles are not regularly cleaned. In this way, conventional continuous electrostatic ink jet technology suffers from the same drawbacks noted in the background section above for drop-on-demand ink jet printing, in which satellite droplets are generally inevitable, particularly with fluids in higher viscosity ranges. In practice, due to the nozzle and electrode geometry of the conventional continuous flow ink jet print head, satellite droplets may even pose a larger constraint for conventional electrostatic continuous ink jet print heads used in component fabrication than for drop-on-demand print heads. Because of this susceptibility to clogging due to satellite droplets, then, conventional continuous ink jet print apparatus may not provide a sufficiently robust solution for web-based electronic component fabrication.

In one alternative embodiment, magnetic forces can be used to cause selective deflection of appropriate material.

Depositing Highly Viscous Fluids

As noted in the background section above, highly viscous fluids have proved particularly troublesome for conventional droplet ejection apparatus. The drop-on-demand method that is conventionally used applies energy, in the form of heat or pressure, to force individual droplets from a meniscus formed at each nozzle. However, many highly viscous fluids exhibit high-low shear viscosity, with values ranging from 5 to 10,000 centipoise (cP) for example. A number of conductive and photoemissive polymers have viscosities in this range. Applying the needed heat energy for phase change of these materials may cause excessive spattering, satellite drops, or clogging in a conventional drop-on-demand or conventional electrostatic continuous ink jet print head. As noted in the background section hereinabove, these tendencies reduce droplet placement accuracy, size, and resolution and have constrained the usability of such highly viscous fluids for ink jet deposition.

As has also been described above, continuous ink jet print heads operate in a very different manner from drop-on-demand print heads with respect to fluid handling. Because the continuous ink jet print head operates by steering fluid droplets from a continuously flowing stream or series of droplets, forced under fluid pressure, this type of print head enjoys a shear thinning effect on highly viscous fluids. That is, once a highly viscous fluid begins to flow, its viscosity is dramatically lowered, yielding an effective viscosity, for droplet formation, that can easily be a few orders of magnitude below the viscosity of the stationary fluid. This inherent difference in fluid handling at the nozzle gives continuous ink jet printing an advantage over other droplet-forming mechanisms, such as drop-on-demand devices that induce a phase change to form droplets. As a result, highly viscous fluids such as polymers used for PLED fabrication and for forming conductive traces and electrodes, fluids that may easily prove out of range for conventional drop-on-demand printing, could be usable with methods that deposit droplets from a continuous stream of printing droplets, such as in a continuous ink jet print head, and can be deposited with precise droplet volume control and placement accuracy, providing high resolution.

A number of developments have improved both the method of fluid droplet formation and methods for droplet deflection for continuous flow ink jet printing. For example, U.S. Pat. No. 3,709,432, issued to Robertson on Jan. 9, 1973, discloses a method and apparatus for stimulating a filament of working fluid causing the working fluid to break up into uniformly spaced ink droplets through the use of transducers. The lengths of the filaments before they break up into ink droplets are regulated by controlling the stimulation energy supplied to the transducers, with high amplitude stimulation resulting in short filaments and low amplitude stimulation resulting in longer filaments. A flow of air is generated across the paths of the fluid at a point intermediate to the ends of the long and short filaments. The air flow affects the trajectories of the filaments before they break up into droplets more than it affects the trajectories of the ink droplets themselves. By controlling the lengths of the filaments, the trajectories of the ink droplets can be controlled, or switched from one path to another. As such, some ink droplets may be directed into a catcher while allowing other ink droplets to be applied to a receiving member.

Figure 4:
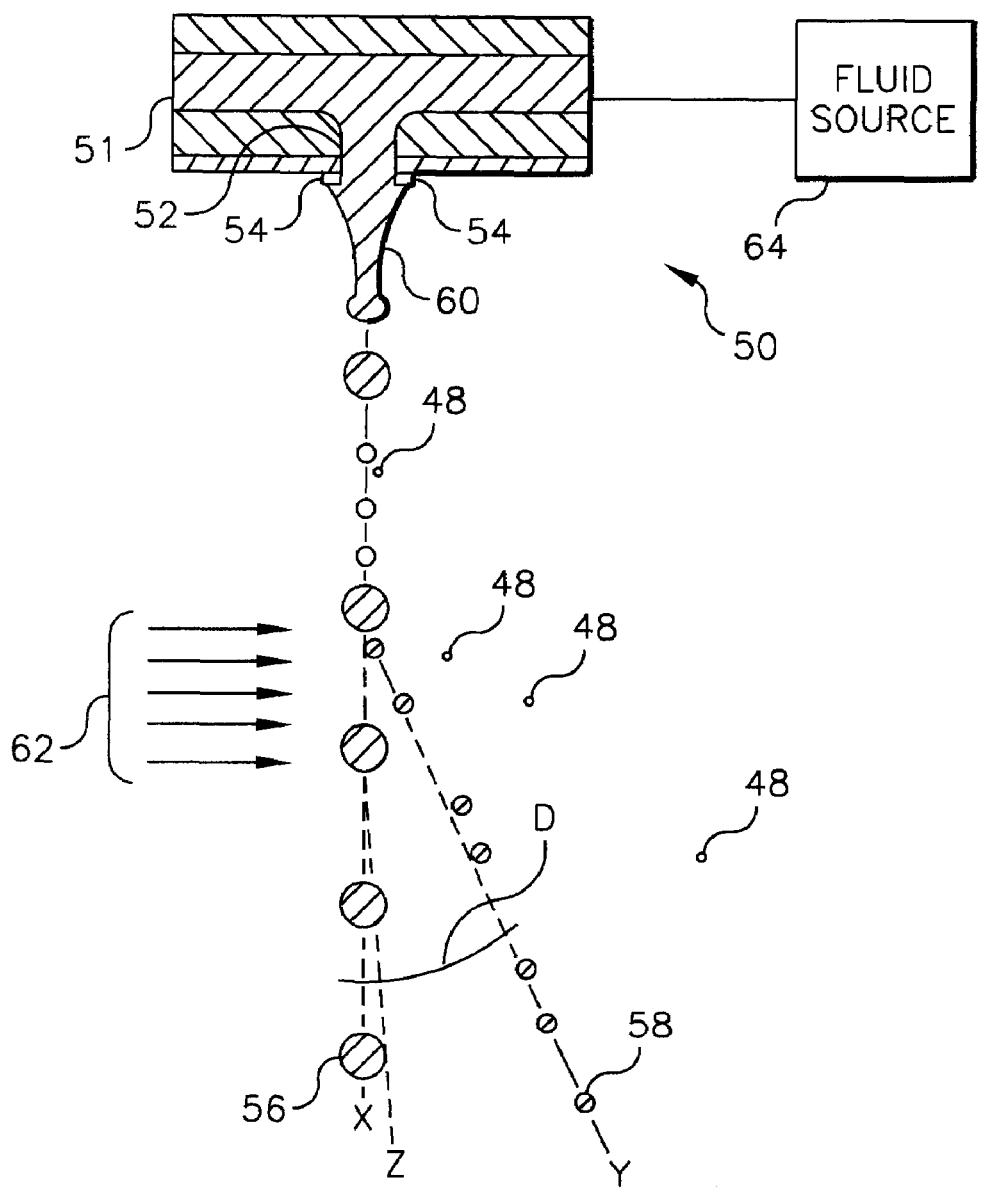
FIG. 4 is a close-up cutaway side view showing a single nozzle of an improved type of continuous ink jet print head using gas flow to selectively deflect droplets for printing.

Referring to FIG. 4, there is shown another type of continuous ink jet printing head. Commonly assigned U.S. Pat. No. 6,517,197, issued to Hawkins et al. on Feb. 11, 2003, discloses a continuous ink jet nozzle 52 that uses actuation of asymmetric heaters 54 to form individual fluid droplets 56, 58 from a flow 60 of fluid 51 and applies a gas pressure differential as the deflection force 62 for fluid droplets. A print head 50 includes a pressurized fluid supply 64 having fluid 51 comprising a carrier fluid having a material therein and asymmetric heaters 54 operable to form printed fluid droplets 56 and non-printed fluid droplets 58. Printed droplets 56 flow along a printed fluid droplet path X, generally normal to the receiving medium surface, wherein the path X, in practice, is slightly shifted by force 62 to take path Z as shown in FIG. 4, ultimately striking a receiving medium, while non-printed fluid droplets 58 flow along a non-printed fluid droplet path Y ultimately striking a gutter or catcher surface (not shown in FIG. 4). Non-printed fluid droplets 58 are recycled or disposed of using the catcher.

Variations and improvements to this type of continuous ink jet printer are disclosed in a number of commonly assigned patents, including the following:

Commonly assigned U.S. Pat. No. 6,588,888, (Jeanmaire et al.) discloses a continuous ink jet printer capable of forming droplets of different size and with a droplet deflector system for providing a variable droplet deflection for printing and non-printing droplets;

Commonly assigned U.S. Pat. No. 6,491,362 (Jeanmaire) discloses an apparatus and method for varying print drop size in a continuous ink jet printer to allow a variable amount of droplet deflection in the fast scan direction with multiple droplets per pixel;

Commonly assigned U.S. Pat. No. 6,213,595 (Anagnostopoulos et al.) discloses a continuous ink jet apparatus and method that provides ink filament steering at an angle offset from normal using segmented heaters;

Commonly assigned U.S. Pat. No. 6,508,543 (Hawkins et al.) discloses a continuous ink jet print head capable of displacing printing droplets at a slight angular displacement relative to the length of the nozzle array, using a positive or negative air pressure;

Commonly assigned U.S. Pat. No. 6,572,222 (Hawkins et al.) similarly discloses use of variable air pressure for deflecting groups of droplets to correct placement in the fast scan direction; and Commonly assigned U.S. Patent Application Publication No. 2003/0174190 (Jeanmaire) discloses improved measurement and fast scan correction for a continuous ink jet printer using air flow and variable droplet volume; and Commonly assigned U.S. Pat. No. 6,575,566 (Jeanmaire et al.) discloses further adaptations for improved print droplet discrimination and placement using variable air flow for each ink jet stream.

For electronic device fabrication in particular, the improved continuous stream ink jet print head described in the commonly assigned Hawkins et al. '197 patent offers a number of advantages over earlier continuous ink jet print head designs that employ electrostatic deflection for droplet steering, as was shown in FIG. 3. Significantly, because it uses gas pressure differential (optionally assisted by heat application) for droplet steering, the continuous stream print head described in the commonly assigned Hawkins et al. '197 patent is capable of depositing insulator materials as well as conductive materials. Because it employs a directed differential gas pressure for stream deflection, the continuous stream print head described in the commonly assigned Hawkins et al. '197 patent enables the matching of suitable gases to the deposited material, either for conditioning droplets along their trajectory, for conditioning "waste" droplets for eventual recycling and reuse in the printing apparatus, or for providing a controlled environment for droplet travel, such as using an inert gas to protect the droplet from contamination, oxidation, or other effects. The continuous ink jet print head that uses gas flow differential for directing droplet trajectory is advantaged both for its capability to condition printed fluid droplets 56 (FIG. 4) in their trajectory path and for its capability to condition the surface to which printed fluid droplets 56 are directed. The gas flow may condition the fluid or the receiving surface by employing an inert gas, a vapor, a heated air source, or some other treatment, for example. Thus, in addition to steering printed fluid droplets 56, gas flow could also provide this additional conditioning function.

Droplet size can be easily managed, as well as precise droplet position and ejection timing. In addition, ink jet nozzles can be tightly spaced when using the continuous stream print head described in the commonly assigned Hawkins et al. '197 patent, allowing high resolution and precision placement.

The capability of the improved continuous ink jet print head that uses gas flow for directing droplet trajectory also proves to be particularly advantageous where purity of deposited materials is important. For photoemissive polymers, for example, there is no need to add salts or other impurities to the polymer fluid to aid in conductivity for electrostatic deflection. Such additives could compromise polymer performance, flexibility, and/or adhesion properties.

The capability for forming droplets of different sizes, as disclosed in the '888 Jeanmaire et al. patent, is a particular advantage available from continuous ink jet technology. This capability allows deposition of exacting amounts of material from each nozzle, allowing features to be formed on the support with high throughput and with a high degree of dimensional accuracy.

These notable advantages over conventional drop-on-demand technology would make continuous ink jet printing particularly attractive for depositing material onto a quickly moving support in a web fabrication environment. However, as is described subsequently, some adaptation of existing continuous ink jet printing methods is needed in order to make this technology usable for component fabrication.

Yet another type of droplet deposition device that may be advantaged for component fabrication in various embodiments is the continuous ink jet print head disclosed in commonly assigned U.S. Pat. Nos. 6,474,795 and 6,695,440, entitled "Continuous Ink Jet Printer with Micro-Valve Deflection Mechanism and Method of Controlling Same" to Lebens et al. The apparatus described in the Lebens et al. '795 and '440 disclosures employs valve mechanisms to direct ink jet flow at each nozzle. That is, the continuous ink jet printer disclosed by Lebens et al. employs a differential fluid pressure for directing the flow of a stream of ink droplets.

In summary, continuous ink jet printing operates by emitting, from each nozzle in an array, a continuous series or stream of fluid droplets and by selectively steering one or more droplets from this series toward the support. The fluid is supplied to each nozzle under pressure, with various types of mechanisms provided for forming and directing the droplet stream from the pressurized fluid and for selective deflection of individual droplets from the droplet stream. Previously dedicated to high-quality color printing applications, the continuous ink jet method of droplet deposition enjoys a number of inherent advantages over other methods of droplet deposition for other types of fluidic materials. Because it generates and manipulates a continuous stream of tiny droplets, the continuous ink jet method provides a higher droplet frequency than other droplet deposition methods and is capable of both high resolution and high volume delivery. Thus, unlike other types of droplet deposition devices that require a support 14 to be rigidly held in position as material is deposited, continuous ink jet print apparatus can be adapted for forming surface features used in the fabrication of electronic, display, and optical components onto a continuously moving support 14.

However, the demanding requirements for handling fluids having a wide range of viscosities and for preventing the deposition of satellite droplets that are inevitably generated during droplet formation indicate that some amount of adaptation of continuous ink jet printing methods is necessary in order to use these devices in a web-based component fabrication apparatus.

Adapting Droplet Stream Technology to Web-Based Component Formation

In light of the above-noted technical hurdles and limitations, it can be seen that the type of droplet stream technology generally used for continuous ink jet printing has inherent advantages for accurate delivery of a wide range of fluids onto a moving support 14. No other droplet formation technology offers the capability for accuracy, high-volume delivery, and range of fluid types that are potentially available using a generated stream of droplets. However, a number of problems need to be solved for adapting this technology to component fabrication.

Among the inherent problems of any droplet-forming method has been the problem of satellite droplet formation. As was noted in the background section above, drop-on-demand ink jet print heads particularly suffer from this droplet formation anomaly, which severely constrains the usability of that type of technology for high-density component fabrication. Similarly, conventional electrostatic ink jet print heads are susceptible to clogging due to satellite droplet generation. The more recent continuous ink jet print head technology of the Hawkins et al. '197 disclosure using gas differential deflection typically also generates some percentage of unwanted satellite droplets 48 as shown in FIG. 4, which can be emitted onto the support 14.

Figure 11:
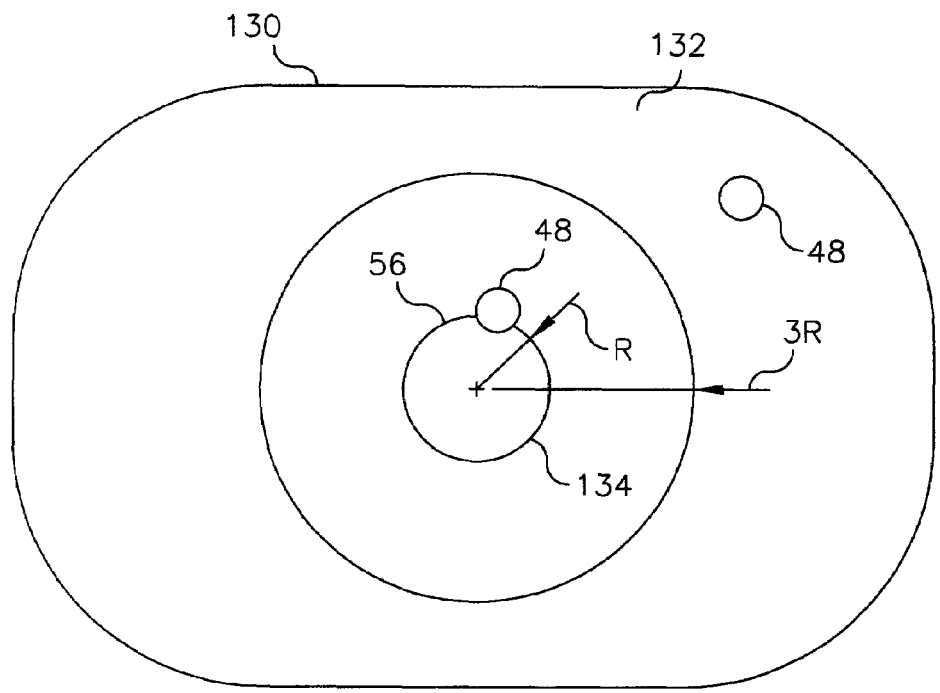
FIG. 11 shows a top view of a section of an article having a printed droplet within an area also containing a satellite droplet.

Referring to FIG. 11, there is shown a plan view of printed droplet 56 deposited at its intended location on the support 132. Unwanted satellite droplets 48 have also been deposited on the support 132. Using the apparatus and methods of the present invention, the density of satellite droplets can be reduced to an average of no more than one satellite droplet 48 within the area of a circle centered at printed droplet 56 and three times the radius R of printed droplet 56.

Figure 5A:
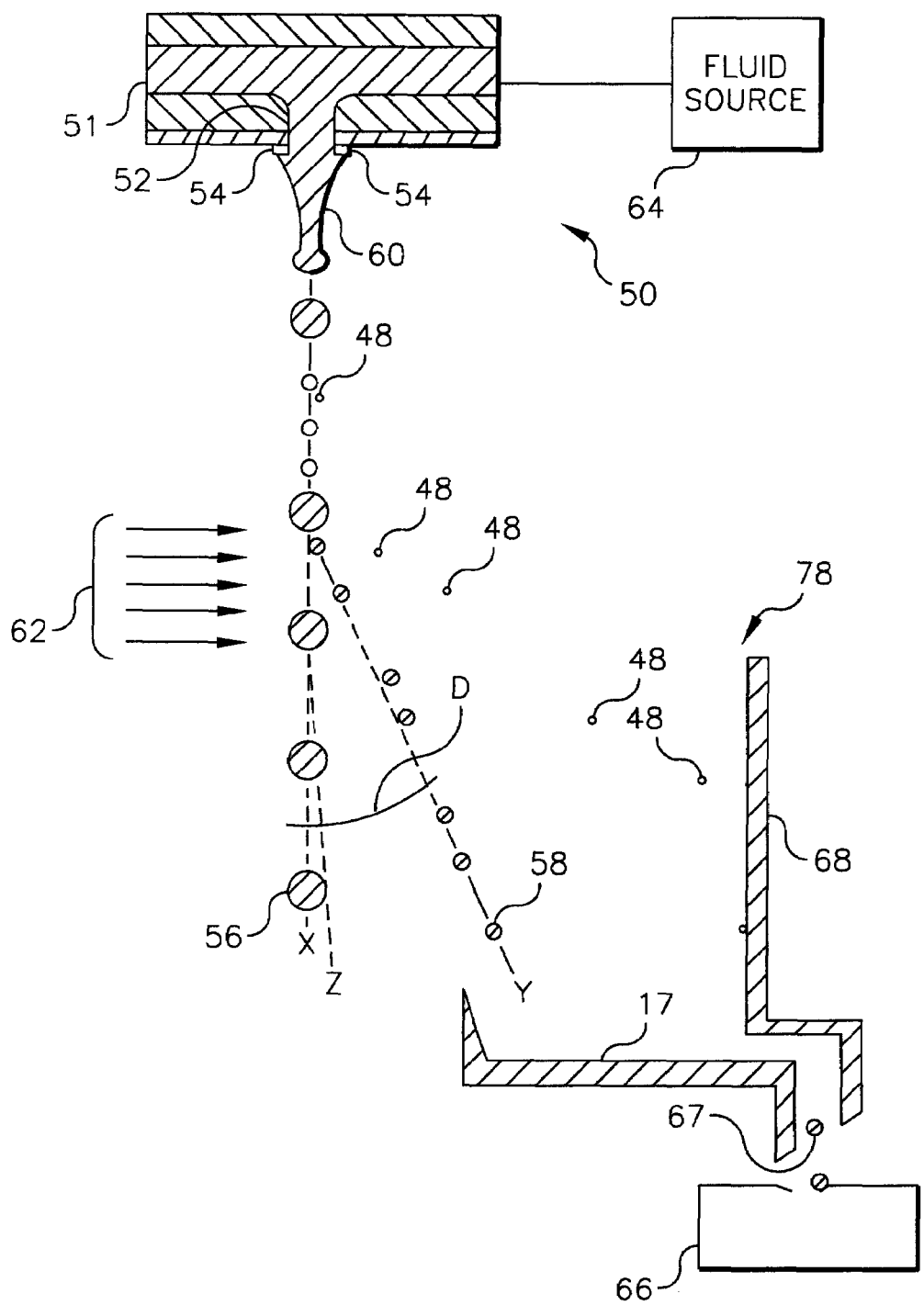
FIG. 5A is a close-up cutaway side view showing a single nozzle of a continuous ink jet print head adapted according to the present invention, with added gutter, shielding, and collection structures for both non-printing and satellite droplets.

FIG. 5A is a close-up cutaway side view showing a single nozzle of the continuous ink jet print head adapted according to the present invention, with added gutter, shielding, and collection structures for both non-printing and satellite droplets. As shown in FIG. 5A, there is an arrangement of a satellite droplet guttering system 78 for nozzle 52, for suppressing the emission of satellite droplets 48 in a configuration using gas differential deflection. Satellite droplets 48 are blocked by a shielding element 68 that cooperates with gutter 17 to collect both satellite droplets 48 and non-printed droplets 58 as waste for possible recycling. Diverted fluid droplets 67 are directed to a collection vessel 66 for recycling, reconstitution, or disposal. In one embodiment, satellite droplet control surface 68 is a stainless steel baffle disposed near the output of print head 50.

Figure 5B:
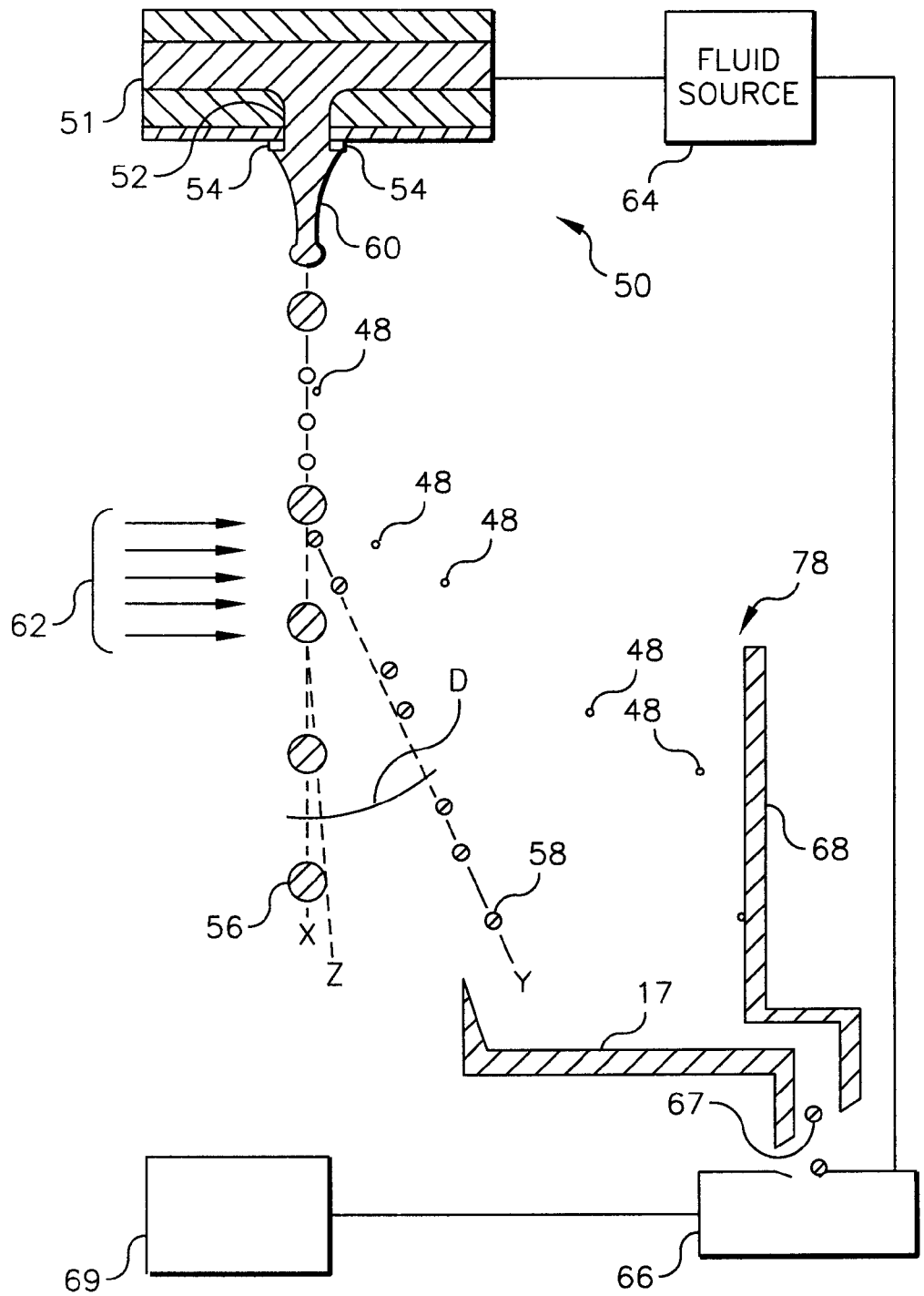
FIG. 5B is a close-up cutaway side view showing a single nozzle of the continuous ink jet print head 4 adapted according to another embodiment of the present invention, with added gutter, shielding, collection, and recycling structures for both non-printing and satellite droplets.

Shielding element 68 may be coated for optimal performance, such as to prevent or delay drying of satellite drops 48 thereon. Suitable coatings could be selected from various types of materials exhibiting low surface-energy properties, such as Teflon coatings, self-assembled monolayers consisting of organothiol compounds on gold-coated surfaces, or alkoxysilanes on metal oxide surfaces, such as on silicon oxide, for example. An active rinsing mechanism (not shown) could optionally be deployed for wetting surfaces of shielding element 68, gutter 17, and related structures to prevent or delay drying. A rinsing mechanism would typically apply a solvent solution of some type, suitable for the fluid being deposited. FIG. 5B shows an alternate embodiment in which satellite droplet guttering system 78 components either direct diverted fluid droplets 67 back to fluid source 64 or to an optional reconstitution vessel 69 for reformulation. Of course, separate guttering components could be used for non-printed droplets 58 and satellite droplets 48, so that, for example, only on the larger non-printed droplets 58 are recycled.

Figure 5C:
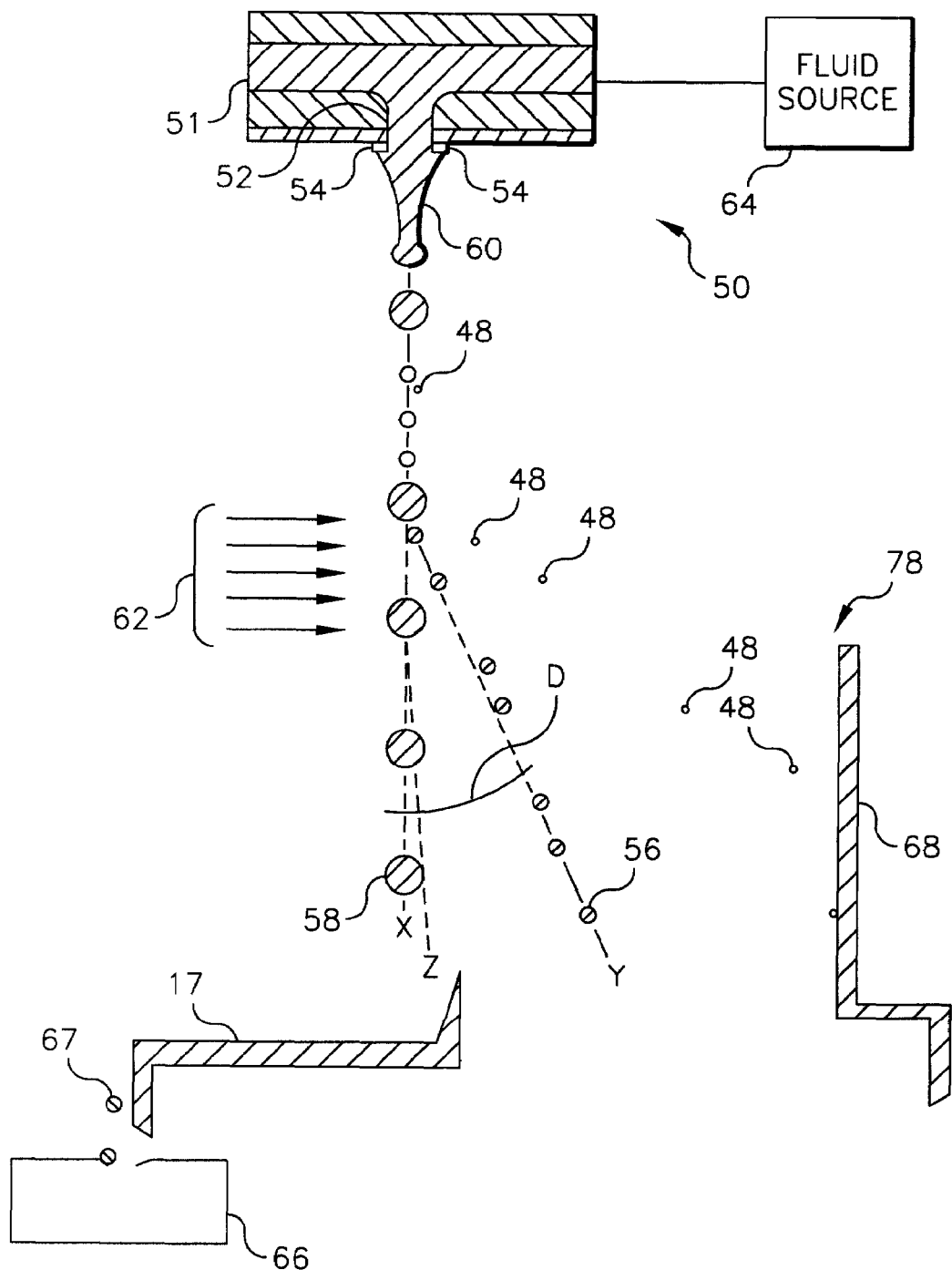
FIG. 5C is a close-up cutaway side view showing a single nozzle of the continuous ink jet print head adapted according to still another alternate embodiment of the present invention, with added gutter, shielding, collection, and recycling structures for both non-printing and satellite droplets, wherein diverted droplets are directed to the support.

Referring to FIG. 5C, there is shown an embodiment in which printed droplets 56 are diverted. With this embodiment, the arrangement of satellite droplet guttering system 78 can be suitably altered so that both non-printed droplets 58 and satellite droplets 48 are directed to collection vessel 66 or so that these droplets are otherwise separately collected.

Another problem not solved using conventional droplet formation methods is adaptation to the rheology of the fluid(s) to be deposited. Nozzle 52 and its support structures can be scaled to form a stream of droplets of suitable size for the fluid and for fluid volumes being deposited.

A further adaptation to surmount limitations of volume delivery range relates to the capability to deliver fluid from multiple nozzles 52 simultaneously to the same point on the support 14. This capability is a result of the flexibility allowable in distance between nozzle 52 and the support 14 surface. Using such a technique, volume delivery of droplet stream technology, already advantaged over other droplet deposition methods, can be effectively doubled, or even further increased.

Fabrication Apparatus

Figure 1A:
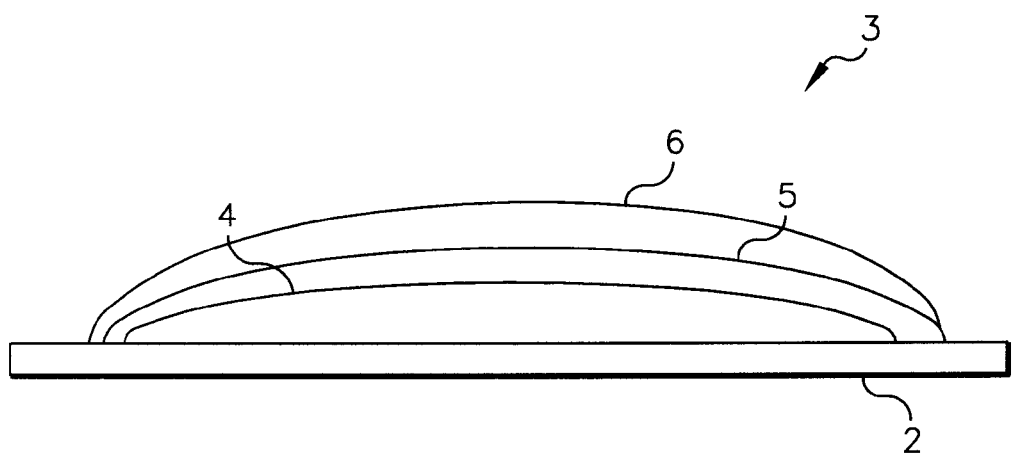
FIG. 1A shows a cross section view of a structure formed on a substrate using multiple printing passes as is known in the prior art.
Figure 1B:
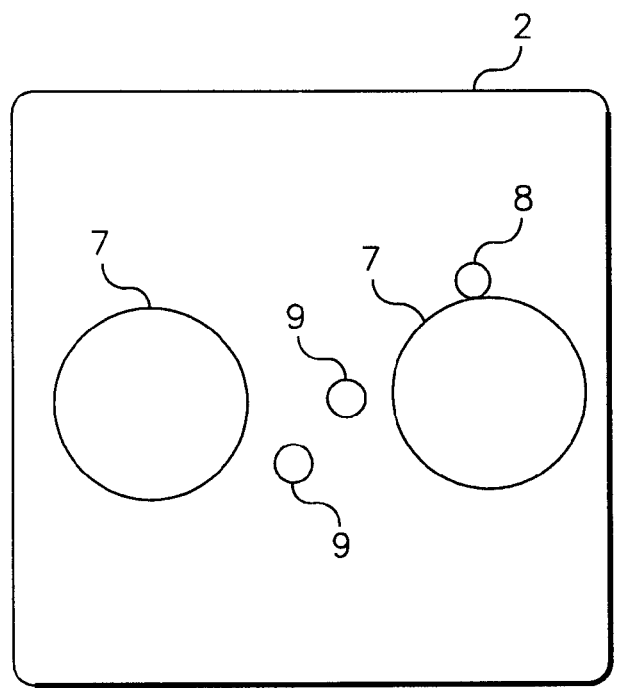
FIG. 1B shows a top view of a substrate having intentionally printed drops of material adjacent to each other with undesirable satellite drops formed in accordance with the prior art.
Figure 1C:
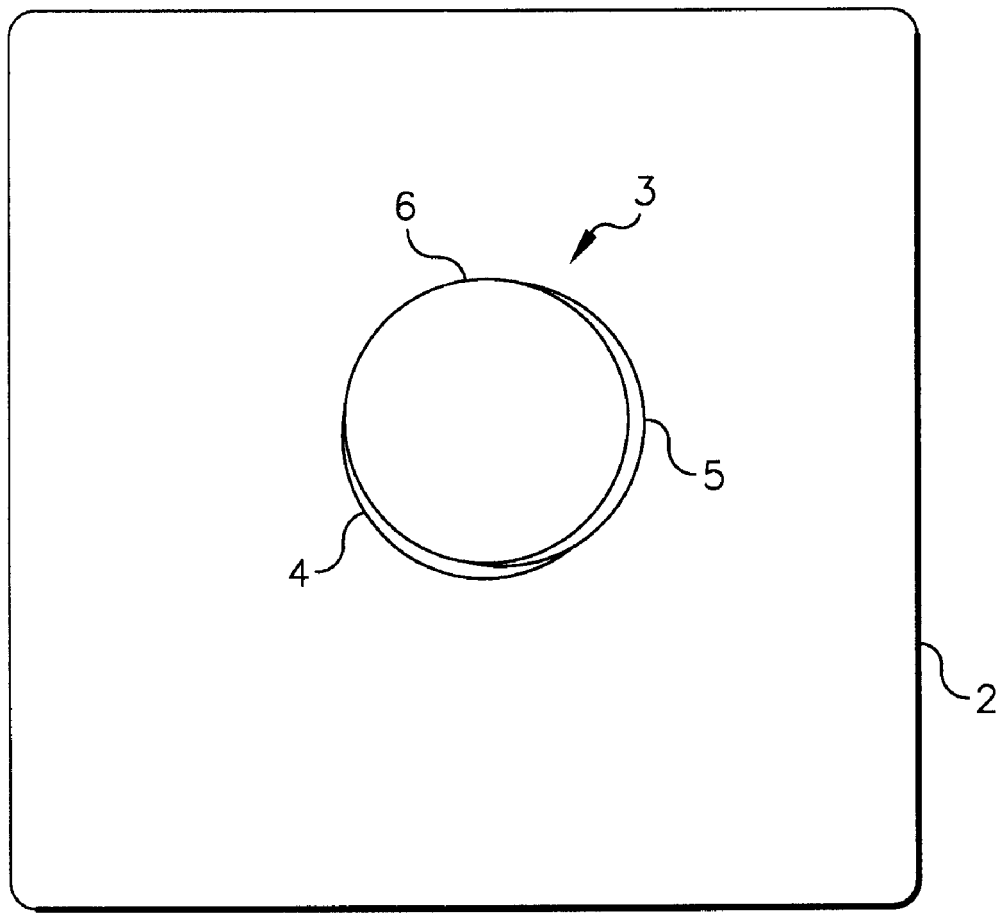
FIG. 1C which is a top view of the structure illustrated in section in FIG. 1A.

For overall component fabrication, the basic set of components of printing apparatus 10 in FIG. 2A would be similarly required as components of a fabrication system. FIG. 2B shows that portion of a fabrication apparatus 11 that is directly related to depositing droplets. A continuous ink jet print head 13, adapted from continuous ink jet print head 12 in FIG. 1, employs an array of printing nozzles specially configured for depositing fluids used in component manufacture. Support 14 is driven continuously in the direction of the arrow by a support transport system including in this embodiment a transport roller 14 and a transport roller driving system (not shown) such as a motor and appropriate control electronics. FIG. 2B also shows a droplet-conditioning device 34 for applying conditioning energy, in some form, to droplet stream 36. This conditioning energy can be an electromagnetic energy such as light or other radiation.

Alternately, conditioning can be performed using a gas or vapor, which can also be introduced using the droplet deflection mechanism, such as the gas flow described subsequently.

Figure 2C:
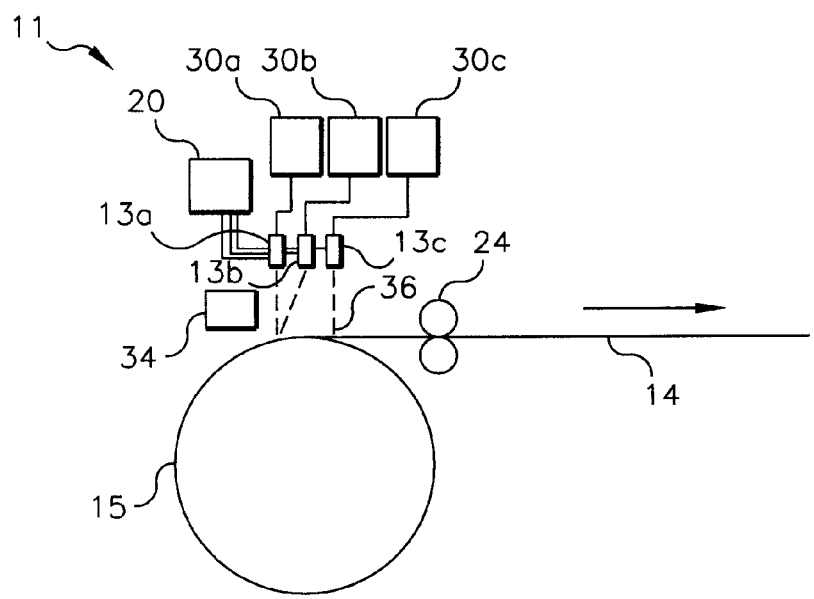
FIG. 2C is a side view schematic block diagram showing a web fabrication apparatus that uses multiple arrays of nozzles for emitting droplet streams.

Referring to the schematic side view representation of FIG. 2C, there is shown an alternate embodiment of fabrication apparatus 11 in which multiple adapted continuous ink jet print heads 13a, 13b, and 13c are used to deposit droplets from streams 36 of different fluids from multiple reservoirs 30a, 30b, and 30c respectively. It can be appreciated that fabrication apparatus 11 can have any of a number of different embodiments for depositing any number of fluids onto the surface of moving support 14. Of course, this could include multiple banks of print heads 13 depositing the same fluid, or different fluids, onto support 14.

As shown in FIG. 2C, it is possible to adjust the direction of nozzles in adapted continuous ink jet print heads 13a, 13b, and 13c, such that two or more nozzles effectively deposit droplets onto the same point on the surface of support 14 at the same time. This advantage is available due to the nature of droplet formation using continuous flow technology and due to the capability to adjust spacing of printing nozzles from support 14 over a range of distances without loss of performance.

Options for Support Types

Support 14 itself could be any of a number of types of material, including flexible support 14 material that can be transported as a web. A suitable flexible support 14 material for electronic and display components could be polyethylene-terephthalate (PET), polyethylene napthalate (PEN), cellulose acetate, metal foil, aluminum or titanium foil, aluminum or titanium alloys, paper, steel including stainless steel, polyvinyl chloride (PVC), polycarbonate, polyimides, glass, and textiles or other types of woven fabric, as disclosed in U.S. Patent Application Publication No. 2004/0053431 entitled "Method of forming a flexible thin film transistor display device with a metal foil support" by Chang et al., for example. Other types of flexible support 14 could be used for a range of alternate applications.

Other types of support 14s suitable for various applications include borosilicate glass, polyethylene, acrylate sheeting, PVC sheeting, polycarbonate sheeting, foams, felt, fiber-reinforced epoxy, PMMA, PCB's, silicon, GaAs, and $LiNbO_3$ crystals, thin film membrane [silicon compound, $SiO_2$, SiC, $Si_3N_4$, etc.], or thermoplastics such as nylon, for example. Yet other types of supports 14 included filled polymer supports 14, such as carbon-fiber filled thermoplastics and voided supports 14.

In another embodiment, support 14 could be a transfer material such as a donor that serves as an intermediate for transfer of component material deposited on its surface onto the surface of a different support 14.

Techniques for Forming Electronic or Optical Devices

The present invention uses a continuously generated stream of printing droplets to deposit one or more fluids that coalesce on a surface and, when suitably dried, form a three-dimensional feature comprising at least one, but preferably most or all of the elements necessary to form an electronic device or optical component, such as a waveguide, photonic bandgap component, lens or lenslet array, or optical coating. In order to form electronic and optical devices with suitable efficiency and yield, environmental conditions such as temperature, humidity, and exposure to light or oxygen must be controlled and cleanliness maintained.

In general, the structure of an electronic device should be designed to facilitate good interfacial reaction between its composite layers, with no striations within any single composite layer. Suitable liquids that can be deposited for conductive, semiconductive, insulating, and opto-electronic functions include, but are not limited to, inorganics, organics, hybridized inorganic-organic systems, and polymer-based materials compatible with conventional evaporation or radiation enhanced drying, low temperature crystallization, annealing, or curing, and radiation cross-linking or chemical bond scission or reformation.

For depositing polymer layers, fundamental properties of ideal surfaces include the following:

(i) The polymer surface can range from partially polycrystalline to amorphous. With the exception of polydiacetylenes, single crystal polymer surfaces are essentially unknown.

(ii) Light emitting polymers tend to be large, flexible, covalently bonded chains. Polymer surfaces generally consist of gently curved sections of polymer chains, with occasional chain ends. The polymer chains can be preferentially parallel or perpendicular to the surface. Surface energy effects can cause orientation of polymer chain side groups either outward from the surface or inward towards the bulk of the film formed from the printed liquid, forming a variety of conformations.

(iii) The electronic surface region has dimensions that range from about 0.1 nm (1 Angstrom) to 1 nm (10 Angstroms). Mechanical and chemical properties of the surface may influence the bulk material performance to a greater depth.

(iv) Inorganic crystalline lattice (3-D periodicity) surface state formation defects are rarely observed on carefully prepared polymer surfaces. Dangling and unsatisfied surface bonds are rarely observed. For conjugated polymers, the covalent bonds are satisfied, and the largely one-dimensional nature of the polymer chains is preserved, despite the gentle curvature, bending, and end chain termination occurring at or near the surface.

Forming a Thin-Film Transistor

In one embodiment, the component formed by a printing apparatus 10 of the invention is an electrical component, such as a field effect transistor, preferably having a multiple layer printed structure. Each component layer of the transistor can be formed from polymeric material. Deposition from a stream of droplets can be used for single or for multiple layers of the device, for example, for the organic semiconductor and/or insulator. In one embodiment, an adapted continuous ink jet print mechanism, with nozzles and supporting structures adapted according to the present invention is used to fabricate the complete device, including semiconductor layer, insulating layer, metallic contacts, and encapsulation and protective coating layers. Preferably, the device is fabricated onto a flexible, moving support 14, using successive droplet deposition steps.

In order to fabricate a polymer transistor capable of controlling a light emitting element, droplet deposition of a component material from a continuous stream may be employed for forming one or more of a number of key layers, such as the following:

(i) Gate Dielectric. Suitable materials the gate dielectric can include BenzoCycloButane (BCB), polysiloxane, polyaniline, and polymethyl methacrylate (PMMA), for example.

(ii) Semiconductor materials. Suitable materials include pentacene and polythiophene, for example.

(iii) Light emissive polymers, including polyfluorene and MEH-PPV (poly[2-methoxy-5-(2'-ethyl-hexyloxy)]-p-phenylene-vinylene), for example.

(iv) Protective Sealant. Suitable materials for protective sealant can include multifunctional UV curing acrylates and organically modified ceramics (such as organosilane derivative), for example.

(v) Polymeric Conductors. Suitable materials for the polymer conductor can include polyaniline (for example, blended with polyethylene or other suitable substance) and polythiophene, for example.

Figure 6A:
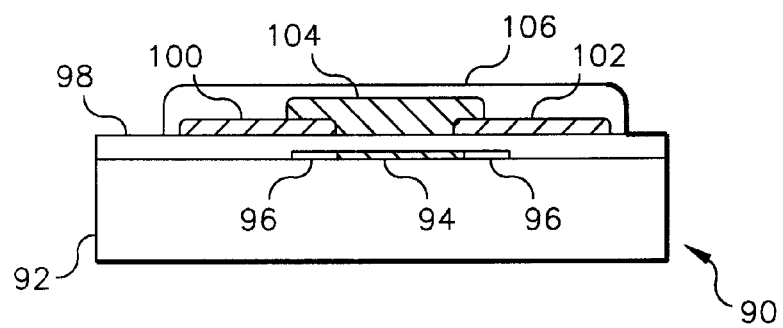
FIGS. 6A and 6B are cross-sectional views of a transistor fabricated using the methods and apparatus of the present invention.
Figure 6B:
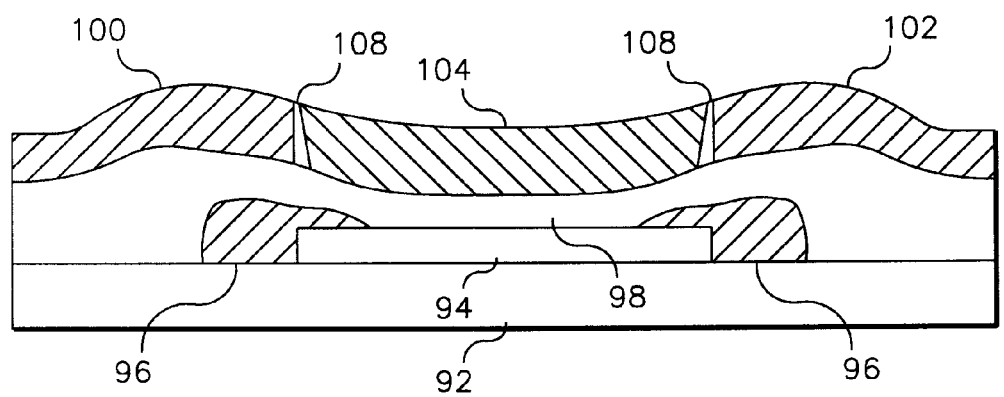

Referring to FIGS. 6A and 6B, there are shown cross-sections of a field effect transistor 90 formed on a support 92. Transistor 90 comprises a gate region 94 formed from doped polyaniline or from Cu[hfacac]; a gate region insulator spacer 96 formed from polyimide, PMMA or siloxane; a gate insulator 98 formed, depending on the gate characteristics, from polyimide or siloxane; a source region 100 formed from doped polyaniline or Cu[hfacac]; a drain region 102 also formed from doped polyaniline or Cu[hfacac]; and an active semiconductor region 104 formed from pentacene, preferably doped pentacene. An acrylate-doped ormocer or methoxysilane-based protective layer 106 can be formed over the surface of transistor 90 for hermetic isolation of transistor 90.

Gate region insulator spacers 96 are shaped for control of the electric field gradient at the edges of gate region 94 in order to minimize leakage current. Spacers 96 can have any desired shape, within the limits set by droplet size and curing technique used.

As an example, a fabrication method using selective droplet deposition from a continuous stream of droplets may comprise the following steps:

(1) depositing gate region 94 on support 92;
(2) depositing gate insulator layer 98 over gate region 94;
(3) depositing source region 100 and drain region 102 on gate insulator layer 98, where source region 100 is separated from drain region 102; and
(4) depositing active semiconductor layer 104 between source region 100 and drain region 102.

This method may further comprise, prior to depositing gate insulator layer 98, the step of depositing a gate electrode insulator layer at each end of gate region 94. This may further comprise, prior to depositing active semiconductor region 104, the steps of depositing interface layers on facing walls of drain and source regions 102 and 100 into which the active semiconductor material diffuses, during deposition or curing, to control the barrier height of transistor 90. The method may further comprise the step of depositing an organically modified ceramic layer over transistor 90 for hermetic isolation of transistor 90.

Polymeric transistor 90 can be deposited directly onto a wide variety of support 92 including flexible supports. The list of possible supports includes, for example, thin film single crystal, polycrystalline, or amorphous surfaces, single bulk crystals, glass, plastic, metal including metallic alloys, treated or untreated paper or card, or any temperature sensitive material including low glass transition temperature plastics, or a range of or synthetic or artificial substitutes. This support 92 can be provided in a continuous form or fed as individual sheets.

Referring to FIG. 6B, in order to control the barrier height, an interface layer 108 is formed on the facing walls of source region 100 and drain region 102 prior to the deposition of active semiconductor region 104, and into which active semiconductor region 104 diffuses during deposition and/or curing processes. Interface layer 108 may be formed from TCNQ or a liquid equivalent.

A range of liquid material and diluent carrier or dopant properties can be used in manufacture of a practical device or element. For the sake of illustration, and not by way of limitation, particularly suitable fluid properties and ranges could include the following:

Ambient pressure=$1.01 \times 10^5$ to $1 \times 10^{-6}$ N m$^{-2}$;
Boiling point=0 to 250 degrees C.;
Droplet velocity=0.1 to 20 m s$^{-1}$;
Dynamic viscosity=1 to 200 mPa s;
Heat of vaporization=Liquid dependent J mol$^{-1}$;
Liquid density=Liquid dependent, in kg m$^{-3}$;
Material density=Material dependent, in kg m$^{-3}$;
Material solid content=0.0001 to 100%;
Static contact angle to the support=0 to 90 degrees;
Support temperature=270 to 600 K;
Surface tension=20 to 76 mN m$^{-1}$; and
Temperature coefficient of viscosity=Liquid dependent, mPa s K$^{-1}$ Both device structure and droplet properties can be tuned to optimize device performance and behavior. Tunable parameters could include the following:

Electrode geometry and thickness;
Insulating layer geometry;
Liquid droplet dynamic wetting rate and contact angle;
Liquid droplet rheology;
Liquid droplet static contact angle; and
Support fluid capillarity (wicking under existing layers).

Printhead operational reliability and stability depend on parameters including liquid material properties, nozzle geometry and manufacturing processes and materials used for the droplet deposition mechanism. For the potential manufacture of an all-transparent transistor 90, suitably prepared polyaniline can be substituted for the conventional ITO (Indium Tin Oxide) as a transparent electrode. Polyaniline has surface conduction and hole injection performance characteristics comparable to ITO.

Transistor 90 can be a back-to-back diode pair, or may be a field effect enhancement or depletion mode transistor. The capability to form transistor 90 onto a flexible support shows the overall capability of the method of the present invention for fabricating a broader range of electronic and optical devices, including devices employing p-n junctions such as various types of photodiodes, diacs, triacs, thyristors, bipolar devices, field-effect devices, phototransistors, lasers, photodetectors, electronically stimulated light sources, superconducting computers, and very high speed UV, visible, IR opto-electronic switches (PPV and associated derivatives). These devices may provide AC, DC, pulsed, low voltage, or fast switching operation. Selective droplet deposition from a continuous stream of droplets can also be used in the manufacture of inorganic semiconductor devices based on materials such sol-gel ITO, Sn chloride, and other aqueous solutions. For example, the droplets used to form respective layers or regions can be supplied by a series of continuous ink jet droplet deposition printheads adapted as was shown in FIG. 5A. Alternatively, the droplets forming respective layers or regions can be supplied by selective droplet deposition from a continuous stream of droplets provided from a plurality of separate fluid supplies.

Transistor 90 may be a buckminster fullerene and fulleride $C_{60}$-based transistor. The term "$C_{60}$-based" includes other structures of fullerene and fulleride molecules, including, but not limited to, $C_{70}$, $C_{76}$, $C_{78}$, $C_{82}$, $C_{84}$ and $C_{60}$-TDAE (tetrakis-dimethylaminoethylene). These types of transistors have generally higher mobilities and temperature stability than do conventional polymer transistors.

Depositing Conductive, Semiconductive and Dielectric Patterns

Broadly stated, the present invention provides a method of forming any of a number of types of patterned circuit element(s) on a surface using selective droplet deposition from a continuous stream of droplets. Types of circuit element formed could include any component of an electric circuit having an arrangement of layered insulating, resistive dielectric, or conducting materials, including conductive traces between components. The circuit element may be formed from organic, inorganic, or hybrid inorganic-organic materials. Optical components and coatings could also be applied using this method. This can be used for example as generally described above for the purposes of forming, a component of an electroluminescent element, light emitting diode, an organic light emitting diode, polymeric light emitting diode a transistor, a conductor, a resistor, a diode, an optical circuit, an electrical circuit, a fluidic circuit, an opto-electronic device, or an electromechanical device.

The present invention allows features such as patterned circuit elements to be formed using a process that requires fluid deposition only, without photolithographic masking. Using continuous flow droplet deposition, component materials can be deposited only where required, without the need to remove deposited material such as by etching. This enables fabrication of a range of components such as flexible printed circuits, with conductive traces extending between circuit elements. This technique can be effectively used for web-based fabrication, since multiple passes of the same printhead would not be required with continuous flow ink jet printing.

A patterned circuit element formed using printing apparatus 10 (FIGS. 2A, 2B) may be electrically conductive and may additionally include semiconductor or dielectric materials, and can be opaque, absorptive, reflective, or transparent. Optically transparent conductors exhibiting better than 10 Ohms per square resistivity, of considerable interest to the electronics industry in general, are of particular value in manufacture of electro-optic devices such as displays. ITO [indium-tin-oxide], for example, is one very widely employed transparent conductor, advantaged for opto-electronic devices due to its relatively low plasma frequency and transparency to visible light, and is widely used for traces and bus line features. However, ITO can be difficult to pattern. ITO has a work function of 4.7+−0.2 eV, depending upon the morphology and purity of the coating and the deposition method. Alternately, polyaniline has similar work function and surface conduction properties.

A conductor could also be a metallic material, such as might be advantaged for use as the source and drain of a field effect transistor. A suitable metallic conductor may be formed from organometallic or metallo-organic compounds, such as those used for the deposition of copper, for example:

Cu[COD]hfacac—(hexafluoroacetylacetonate)Cu(1,5cyclooctadiene); and
Cu[TMVS]hfacac—(hexafluoroacetylacetonate)Cu(vinyltrimethylsilane).

Other metals, for example, Au, In and Sn, may be included in such compounds. Other suitable conductive deposition materials include ITO sol-gel, metal colloids and inks, organically modified ceramics, and organically modified silicate, for example. As is emphasized in the background section given above, selective droplet deposition from a continuous stream of droplets is generally advantaged over alternative droplet placement methods for depositing colloidal materials. In another embodiment, polymeric conductors can be used. Conductive polymers include, but are not limited to: polyaniline (which may be highly stretched), polyacetylene (including iodine doped and stretch ordered), polythiophene (including stereoregular), polypyrrole and polysilane compounds (including modular silylenes), stearic acid, substituted pthalocyanines, indoles, and furans.

Typical conjugated polymers include, but are not limited to the following: trans-polyacetylene, PA, poly(para-phenylenevinylene), PPV, and poly(para-phenylene), PPP, polyaniline, polyacetylene, polythiophene, polypyrrole compounds, polysilane compounds, stearic acid, substituted pthalocyanines, indoles, furans, cis- and trans-polyacetylene, polyparaphenylene, polydiacetylenes, polybithiophenes, polyisothianapthene, polyphenylenesulfide, polythienylvinylenes, polyphenylenevinylenes, EDOT (3,4-ethylenedioxythiophene), and PEDOT (polyethylenethioxythiophene). Alternately, other opaque materials such as carbon black could be used.

The patterned circuit element may comprise a plurality of stacked electrically conductive elements connected by via holes for electrical contact between layers. A circuit element may have one or more isolation layers disposed between adjacent elements. Such an isolation layer can prevent electric field interactions or interference between adjacent powered electrodes.

Electrical contacts or electrodes can be deposited to provide connection to an electrical, electronic, or optoelectronic device. The contact area geometry and materials employed determine the overall quality of the electrical contact. Selective droplet deposition from a continuous stream of droplets can also be used to form a pre-patterned conductive structure onto a support. For example, variably spaced contacts can be deposited onto a piezoelectric ceramic, onto a thick film, or onto a thin film element. A continuous ink jet printing mechanism adapted according to the present invention provides a means of depositing conductive element patterns without the need to use whole-area thin or thick film deposition methods in conjunction with photolithographic patterning and wet or dry etching techniques.

In yet another aspect, the present invention provides a method of forming conductive patterns by conditioning the electrical conductivity of a material. For example, this method can be used to enhance conductivity of at least part of a partially cured insulating layer using electrostatically focused electrically conductive particles deposited using continuous ink jet printing. Selective droplet deposition from a continuous stream of droplets can be used to selectively introduce a liquid to a surface to induce electronic state changes at, or close to, the point of printing in order to effect a controlled change in characteristics of the material to be treated. Such controlled doping or loading of a surface or sub-surface region introduces mobile charges that can affect the current carrying characteristics of a component material with a majority (or minority) carrier impurity. The doping can introduce local material property changes as a result of the mode of doping, including chemical, protonic, electrochemical, optical, and electronic changes.

In another embodiment, a continuous ink jet print head adapted according to the present invention can be used to deposit a precursor material for conditioning the characteristics of one or more other deposited materials. For example, a precursor material could be deposited in a pattern, followed by the deposit, coating or application of a second material, thereby forming a patterned conductor due to the reaction of the precursor with the second material. Application of heat, light, or other form of energy can be used to initiate or enhance the reaction of the precursor with the second material. For example, the precursor material could be exposed to a chemical bath resulting in a functional pattern. A specific example of this could be a palladium catalyst precursor pattern that is contacted with an electroless plating solution. The use of precursor materials is well known to those skilled in the device fabrication art.

In one alternative method, a polymerization catalyst is first deposited onto a substrate, in a pattern. Suitable polymerization catalysts for the polymerizable compound may include, for example, metal salts such as ferric chloride, cupric chloride and cupric sulfate; metal oxides such as lead dioxide; peroxo acid salts such as potassium persulfate and ammonium persulfate; quinones such as benzoquinone; diazonium salts such as benzenediazonium chloride; potassium ferricyanide; hexachloroplatinate (IV); and the like. Next, a monomer or oligomer is deposited from an ink jet print head, in a layer overlaying the catalyst pattern. Examples of the polymers which can be formed in this manner include, for instance, organic synthetic polymer such as polyvinyl acetal, polycarbonate, polyvinyl butyral, polyacrylate, polymethacrylate, polymethyl methacrylate, polyethylene, polypropylene, polystyrene, polyacrylonitrile, polyvinyl acetate, polyvinyl chloride, polyvinylidene chloride, polyvinyl fluoride, polyvinylidene fluoride, polyvinylidene cyanide, polybutadiene, polyisoprene, polyether, polyester, polyamide, polyimide, silicone, polyvinyl alcohol, polyvinyl pyrrolidone, polyacrylamide and polyethylene glycol; derivatives thereof; and the like. The polymers include copolymers such as styrene-acrylate copolymer, vinyl acetate-acrylate copolymer and ethylene-vinyl acetate copolymer. Also included are natural polymers such as cellulose, starch, casein and natural rubber; semisynthetic high molecular compounds such as cellulose derivatives, for example methyl cellulose, hydroxyethyl cellulose and carboxymethyl cellulose; and inorganic polymers such as glass, silica and alumina. The catalyst conditions the overlaying polymer compound to form an electrically conductive polymer pattern conforming to the deposition pattern of the original catalyst.

Where a conventional continuous ink jet print head uses electrostatic charge for droplet deflection, conductive particles may be introduced to assist directional steering of droplets towards a selected region of a component. This method can be applied to forming an entire electrically conducting element, such as an electrode or trace, or to the treatment of a specific location, such as a contact region where conductive particles improve local conduction to provide a region having a lower contact resistance and which can be used as a bonding platform. The rate of diffusion of conductive particles into the layer may be determined by the type or intensity of radiation used to fix or fully cure the layer.

Forming metal and/or inorganic transparent patterned conductors involves depositing a precursor material onto a moving web using selective droplet deposition from a continuous stream of droplets and subsequent thermal processing to produce the final conductor material. Conversion processes include Metal-Organic Decomposition (MOD) in which a metallo-organic molecular material is dissolved in a solvent and could include optional film-forming additives. With MOD, for noble-metals, the deposited precursor films can be pyrolyzed in air to produce the metal films. For non-noble metals, thermal decomposition can be performed in an inert or a reducing environment. The MOD approach can also be applied to transparent conducting oxides, although relatively high processing temperatures require compatible support materials. Certainly, metals, oxides, and various glass types are candidate web materials for these processes.

An alternative approach is to use metal nano-particle precursors whose very high metal surface areas afford large melting point depression and allow continuous metal films to form from the precursors at very low temperatures. This nano-particle precursor approach is particularly compatible with plastic film webs. Noble metal nano-particle precursors are particularly suitable as materials to be deposited using selective droplet deposition from a continuous stream of droplets for the purposes of producing patterned layers on a moving support, such as is used in web-based fabrication.

Additional processing steps may be required to treat some or all portions of conductive patterns deposited using the droplet deposition method described above. For example, curing treatments, exposure to radiation of selected wavelengths, annealing, or other methods could be used to condition the conductive material.

As noted above, selective droplet deposition from a continuous stream of droplets can be used for materials that are conductors as well as materials that act as semiconductors and dielectrics. The following listing gives an approximate range of resistivity for classifying these materials:
(i) Conductors have resistivity values ranging from about $10^{-4}$ to $10^{-6}$ ohm-cm;
(ii) Semiconductors have resistivity values ranging from about $10^{-3}$ to $10^{12}$ ohm-cm;
(iii) Dielectrics have resistivity values ranging from about $10^{10}$ to $10^{18}$ ohm-cm.

Typical dielectrics of interest include Hydrogensilsesquioxanes, fluorinated benzoxale, Teflon AF, and nanoporous silica.

Depositing a Patterning Mask

Figure 7:
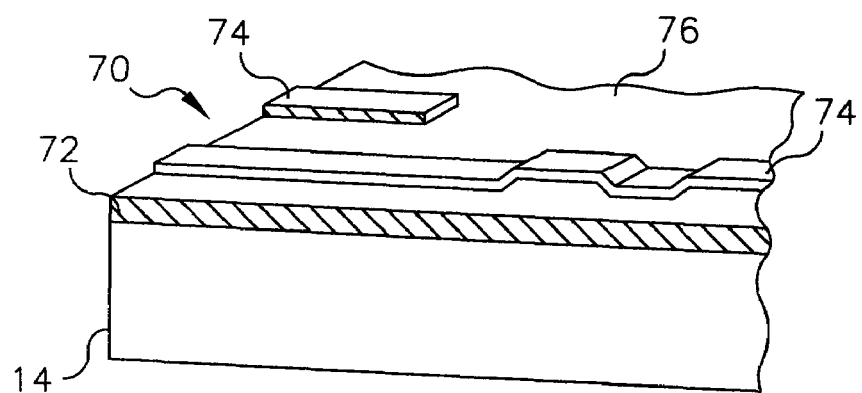
FIG. 7 shows a plane view of a mask deposited using selective droplet deposition from a continuous stream of droplets according to the present invention.
Figure 8:
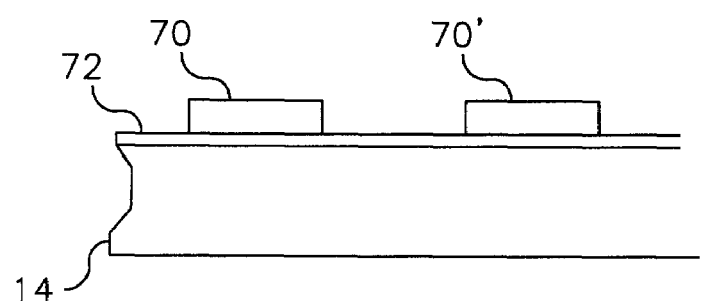
FIG. 8 shows a side view in cross-section of an arrangement of mask sections in one embodiment.

A conductive pattern, or other suitable pattern of material that is a conductor, a semiconductor, or a dielectric, can also be formed using a procedure that combines the steps of depositing a coating having conductive or insulating characteristics, depositing a patterning mask over a portion of the coated area, and processing the masked area to form the pattern. The patterning mask can be made from materials that include, at least in part, photosensitive, radiation sensitive, solvent sensitive, or heat sensitive. The patterning mask may be photosensitive, radiation sensitive or solvent sensitive. Referring to FIG. 7, there is shown, in perspective view, a portion of a patterning mask 70 used to form a pattern in a conductive coating 72 applied to support 14. Coating 72 may be applied using selective droplet deposition from a continuous stream of droplets or by some other suitable coating method, including offset or screen printing, for example. Patterning mask 70 is then applied on coating 72; two portions 74 of patterning mask 70 are represented in FIG. 8. Subsequent processing is then used to remove masked or unmasked portions of coating 72, forming the pattern thereby. Processing for this purpose may use wet or dry chemical processing, photo-processing, or other known etching techniques. Patterning mask 70 may include an oxidant or other substance for conditioning the conductivity or other properties of the underlying material.

Coating 72 can comprise at least in part, one of a polyaniline, polythiophene, organically modified ceramic, organically modified silicate, sol-gel, carbon black, polyaniline compounds, polyacetylene compounds, polythiophene compounds, polypyrrole compounds, polysilane compounds, stearic acid, substituted phthalocyanines, indoles, furans, polyparaphenylenevinylene, polyparaphenylene, polydiacetylenes, polybithiophenes, polyisothianapthene, polyphenylenesulfide, polythienylvinylenes, EDOT, PEDOT, fluids containing particles, metals, semiconductors, conductors, insulators, and glass.

In certain embodiments, one advantage of the masking arrangement shown in FIG. 7 relates to the ability to vary the thickness of coating 72 when using selective droplet deposition from a continuous stream of droplets. Unlike conventional masked pattern formation, in which the thickness of coating 72 is necessarily fairly uniform, the method of the present invention allows areas of variable thickness, such as is represented by depression 76 in FIG. 8. This capability for variable coating 72 thickness enables formation of a conductive pattern of traces having varying thickness, for example, which can be advantageous for providing fusible links or contact electrodes. The use of selective droplet deposition from a continuous stream of droplets for applying a coating layer is particularly advantageous due to the precision control of droplet size available using this method, whether a uniform or non-uniform coating thickness is needed.

A continuous flow ink jet print head, adapted according to the present invention, could be deployed as an alternative deposition device in applications where spray bars are currently used, such as for application of uniform coatings, for example. Advantaged due to size and precision, an adapted continuous flow ink jet print head allows precision placement of coating material, without masking, and allows coating application immediately prior to deposition of other materials.

Nanoscale masking, wherein a masked feature is less than 1 micrometer in one or more in x-axis, y-axis dimensions, is also possible. This implies a feature of size less than or equal to 999 nm. In order to achieve such a feature, it is necessary to consider solution type, surface wetting, and liquid drop surface tension effects, and the potential for nozzle blocking. To alleviate limitations, it is possible to employ methods that promote droplet reduction in flight so that the droplet arriving at the surface to be treated with the pattern is of smaller volume relative to the feature size of interest and to introduce a method of pre-treating the surface either before, during, or following droplet impact, so as to limit surface spreading of the deposited masking fluid. The actual thickness of the nanoscale patterning mask feature depends, at least in part, on the concentration of solid in the printed drop and on the number of layers that are printed one on top of the other.

An example is a method of forming a nanoscale masking feature using a single or multiple printed layer(s) whereby the following are applied:
(i) employ a printhead (single nozzle or nozzle array) that has a nozzle size of preferably less than or equal to 10 microns diameter; and
(ii) use a material that forms a highly homogeneous solution that has been filtered to 0.1 microns and that is soluble in a wide variety of solvents, preferably low boiling point solvents. The solution can be a mixture of variable boiling point solvents to facilitate easy jetting, elimination of nozzle drying, and controlled in-flight evaporation.

The process of evaporation, volatilization, solidification or other change requiring energy transfer can be assisted by an in-situ lamp, laser, solid-state device, or semiconductor-based radiation source, depending upon the properties of the deposited material. The applied electromagnetic wave spectral bandwidths may span, for example, soft X-ray, deep ultraviolet, ultraviolet, visible, infrared, or microwave frequencies. Such a wavelength selectable radiation source can either provide whole area exposure covering the pathway of the droplet from the nozzle to the support surface or could provide a steered, focused, or collimated high intensity radiation source that can be used with a single nozzle (matching nozzle density to laser output density, for example). The radiation source could be a solid-state device, laser, LED, or other source.

Using a conventional approach, masking can be performed by applying a masking layer onto a coating, then performing some treatment that conditions the uncoated and coated areas differently. Alternately, masking can also be effected by selectively treating areas of the coating, without adding a separate masking layer. The treatment applied could use light energy or chemical application, for example.

Forming Integral Mask Layers

Patterned layers of many types, including metal or polymer layers, can be formed using continuous patterned deposition of etch resists over one or more unpatterned or pre-patterned layers. Alternately, one or more of successive patterned layers can be formed by depositing a continuous film over a patterned resist, such as a precursor to a lift-off process. Advantageously, mask layer materials for these and similar results can be readily deposited onto a moving support using selective droplet deposition from a continuous stream of droplets, without the need to increase resolution by passing the support beneath the same print head multiple times.

Useful Mask Materials

Continuous ink jet printing for providing selective droplet deposition from a continuous stream of droplets is flexible and low-cost compared with alternative technologies and enables integral patterned-mask formation on a high-speed web. Useful mask materials that can be deposited using continuous ink jet print heads include polymer layers that can be solvent cast or polymers deposited as liquids at elevated temperature.

Examples of water soluble polymers for this purpose are sodium and calcium polyacrylic acid, polyacrylic acid, polymethacrylic acid, polymethylvinylether co-maleic anhydride, polyvinylpyrrolidone, polyethylene oxide, hydroxypropyl cellulose, hydroxypropyl methyl cellulose, hydroxyethyl cellulose, hydroxymethyl methacrylate, sodium carboxymethyl cellulose, calcium carboxymethyl cellulose, methyl cellulose, maltodextrin, xanthan gum, tragacanth gum, agar, gellan gum, kayara gum, alginic acids, pectins, pre-gelatinized starch, and polyvinyl alcohol, and blends of those polymers.

Some example non-aqueous soluble polymers and thermosetting polymers that could be used for integral masking could include Cellulose acetate, Cellulose acetate butyrate, Polycarbonate, polyethylene, PMMA, Polystyrene, Polystyrene acrylonitrile, PVC, and ABS. Of these PMMA, Polystyrene, and Polystyrene acrylonitrile are preferred for solubility reasons.

Composite Masking

Composite masking techniques can also be provided using selective droplet deposition from a continuous stream of droplets and a combination of additional techniques for selective curing. Referring to FIG. 8, there is shown a cross section view of two sections of patterning mask 70 and 70' deposited on coating 72. Patterning mask 70 and mask 70' can be the same material, subjected to different treatment in curing, so that patterning mask 70 and mask 70' have different characteristics. For example, laser light for curing can be directed to patterning mask 70', but not to mask 70. Or, a curing material could be printed onto patterning mask 70, but not onto mask 70' in a subsequent print operation, such as by a second print head. In this way, a variety of composite masking arrangements are now possible using selective droplet deposition from a continuous stream of droplets.

With reference to FIG. 8, for example, the following composite masking sequence could be performed:

(1) deposit coating 72 on support 14;
(2) deposit masks 70 and 70' in one printing pass, of the same material;
(3) treat mask 70' using laser radiation, leaving mask 70 untreated;
(4) treat exposed areas of coating 72 in a first process;
(5) dissolve mask 70, leaving treated mask 70' in place;
(6) treat exposed areas of coating 72 in a second process; and
(7) dissolve treated mask 70'.

Forming Relief Structures

Material deposition from a continuous stream of droplets may also be used for forming relief structures that contain or channel a fluid to provide a patterned layer or patterned coating. Patterned coatings are generally useful for the fabrication of substantially planar devices, such as electronic displays, for example. In one embodiment, a relief pattern is deposited using a first fluid and, optionally, one or more additional fluids. Droplets of a filler fluid, immiscible from fluids used for the relief pattern, are then deposited to fill channels formed between the various relief structures.

Immiscible fluids may be chosen from water, polar organic liquids, and non-polar organic liquids, or solutions using these liquids as solvents. For example, adjacent lines of non-polar organic liquid or solvent are first printed. Then, while still wet, the space between the adjacent lines is filled with an aqueous solution or water. Upon drying, the material (for example, the conducting polymer) in the aqueous solution is deposited with lateral dimension defined by the spacing between the adjacent lines.

As another example embodiment, a channel can be formed by depositing adjacent lines of a material using selective droplet deposition from a continuous stream of droplets. Once the adjacent lines dry, a filler fluid material could then be deposited. In yet another embodiment, a hydrophobic material (such as carnauba wax, for example) could be deposited onto a relatively hydrophilic support, using ink jet printing, for example. The patterned support can then be coated with an aqueous solution that subsequently dewets from the hydrophobic pattern, creating a pattern of wet and dry areas. This method of preparing heterogeneous coatings or patterned coatings (also termed continuous discrete coatings) would benefit from a high-speed ink jet printing method capable of depositing a hydrophobic material.

Forming Display Devices

Figure 9A:
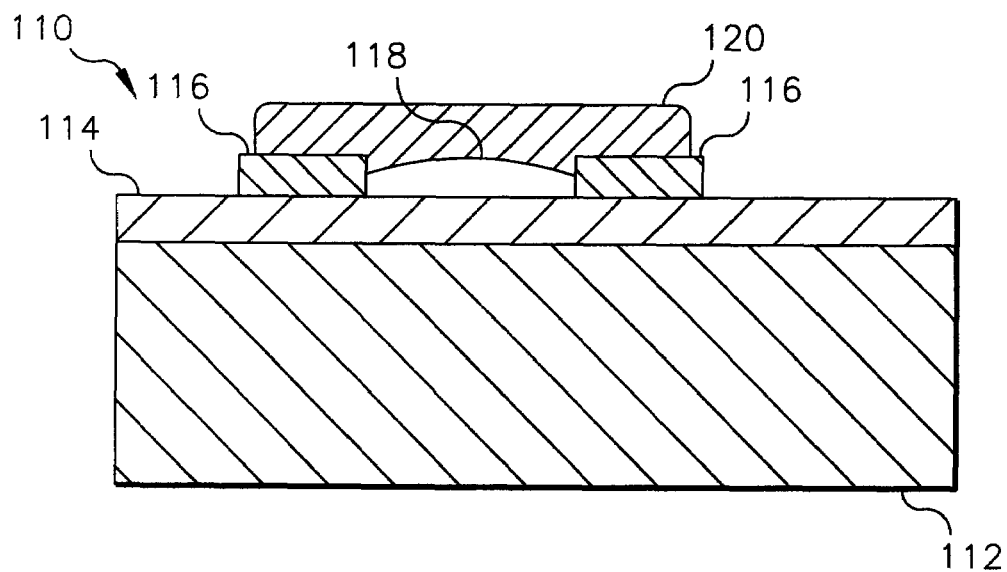
FIG. 9A shows a cross-section of a display pixel fabricated using the methods and apparatus of the present invention.

The present invention also relates to the application of selective droplet deposition from a continuous stream of droplets for forming electro-luminescent and other types of display components, particularly onto a moving support. Referring to FIG. 9A, there is shown, in cross-section, a display pixel 110 formed on a rigid or flexible support 112. A suitable flexible support is polyethylene-terephthalate (PET), for example. Pixel 110 has a base contact layer 114, which may be reflective, formed from aluminum or Cu[hfacac], for example. Upon base contact layer 114 are deposited isolation insulators 116. Isolation insulators 116 can be formed from polyimide, poly-methyl-methacrylate (PMMA) or siloxane. An active polymeric electro-luminescent region 118 is shown and can be typically from a poly(p-phenylene-vinylene (PPV) derivative. A top contact 120 is typically formed from a transparent ormocer or polyaniline. Base contact layer 114 may alternately be opaque or absorptive or may act as a filter, reflecting, transmitting, or absorbing light based on wavelength.

Figure 9B:
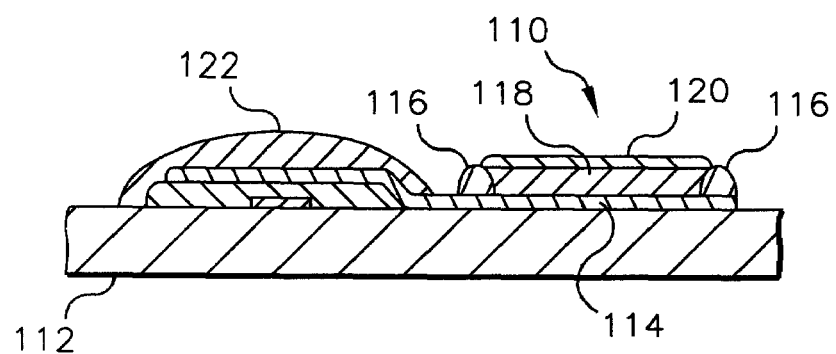
FIG. 9B shows a cross-sectional view of a display pixel and switch.

FIG. 9B is a cross-sectional view showing an alternate display pixel 110 formed on an active switch shown as transistor 122 which is similar to the transistor shown in FIGS. 6A and 6B. Transistor 122 is first deposited on support 112 to form the active matrix backplane. Display pixel containment wells 117 are then printed adjacent to the switching transistor 122, the geometry of the containment optimizing the effect of surface wetting and planarized in-fill. An array of suitable driving circuits and electro-luminescent pixels 110 can be provided for formation of a red, green and blue pixel set, for example.

The present invention also relates to the manufacture and use of an array of pixels 110 in the form of polymer light emitting diodes (PLED). Such a polymer LED array can be manufactured using some combination of evaporation, sputtering, spin-coating, L-B, and droplet deposition methods. The polymer electro-luminescent material used can be selected and tuned for a specific wavelength range. Suitable materials include, but are not limited to PPV and MEH-PPV [poly(2-methoxy,5-(2-ethylhexoxy)-1,4-phenylene-vinylene)]. The polymer LED can be manufactured adjacent to the nozzle array with at least a single emissive pixel 110 at a time, each pixel 110 associated with each print head nozzle.

Selective droplet deposition from a continuous stream of droplets can be used to print either or both the active matrix switching array, or display pixel 110, transistor 122 or an active matrix comprising an array of electrical leads, pixels 100 and transistors 122. Of key importance is the electronic state of the printed interfaces between the active elements of the transistor or the display pixel. Typically, an array of switching transistors 122 is first formed on a flexible support to form an active matrix backplane. Display pixel containment wells are then printed adjacent to the switching transistors (with one set of transistor and charging capacitors per color pixel set). The containment well geometry is designed to optimize surface wetting and planarized in-fill.

It will be appreciated that other types of drive electronics can be formed using such techniques. For example, a direct drive scheme can be formed in like fashion. Direct drive systems are well known in the art for use in addressing segments of a segmented display such as a liquid crystal display of the type found in wrist watches, calculators and the like. With direct drive addressing each segment in the display has its own drive circuit. To turn an individual segment on or off a voltage must be applied to an electrical lead attached to the segment. A common electrical lead is connected to all segments in order to complete a circuit across the segment.

Light emitting polymer pixel 110 can be formed using containing walls to limit the inter-penetrability of the different fluid types required to deposit the transistor and the light emitting pixel or the different emission colors of a full color display. The width of such well structures falls within the Rayleigh criterion for the viewing distance of the screen. Rayleigh's criterion suggests that the observed patterns be considered distinguishable when the first minimum of one falls on the central maximum of the other (or better). When the pupil is small the resolving power of the eye is about $10^{-4}$ radians of arc. This controls the minimum separation of points that are to be distinguishable: the eye can "just resolve" points 0.1 mm (100 microns) apart when they are 250 mm from the eye. This would reduce to about 40 microns at a viewing distance of 100 mm. The material is of such a nature as to be opaque to UV and visible light.

Typical polymer displays include, but are not limited to, light emitting amorphous and small molecule polymers, ferroelectric polymers, electrochromic polymers, photochromic polymers, electrorheologic polymers, electroactive polymers, electro-optic polymers, opto-electronic polymers, and liquid crystal polymers.

For polyaniline (or polyaniline+up to 70 wt % $TiO_2$ particles of size at 20 nm), multiple color changes occur at different electrode potentials in the range −0.2 to −1.0 volts (taken with respect to a standard calomel electrode), with color varying from yellow, through green, to dark blue. Polyaniline is usually operated at below the second oxidation potential, thus providing one color change from pale yellow to green. This means that for full color displays, the polyaniline material needs to be combined with another material such as tungsten oxide or Prussian blue. Photo reduction-based electrochromism is also a possible operating mechanism.

Preferably, the display device has a plurality of portions comprising respective layers of a multi-layer display device. Preferably, the display comprises at least one electrically active display pixel, at least two adjoining portions of each pixel being formed from one or more different deposition materials. Printed materials could include, but would not be restricted to, conjugated polymers (for example, MEH poly (phenylene vinylene); polythiophene; and polyacetyllene derivative.

The display element can be based on a pale yellow color (which can be provided by the deposition of polyaniline) as the neutral transmission color, which color changes to provide the necessary contrast for information transfer to the eye. For polyaniline, multiple color changes occur at different electrode potentials in the range −0.2 to −1.0 volts (taken with respect to a standard calomel electrode). The color varies from yellow, through green to dark blue. Polyaniline is usually operated at somewhat below the second oxidation potential, thus providing one color change from pale yellow to green.

Solution processed OLED materials that can be provided as a fluid for selective droplet deposition from a continuous stream of droplets include soluble small molecules, oligomeric and polymeric materials. The materials can either be dissolved or dispersed in appropriate solvents. Typical oligomeric and polymeric materials include, for example, arenes and arene vinylene derivatives. Suitable polymeric materials include linear polymers, ladder and step ladder polymers, star polymers and hyper-branched polymers. Oligomeric materials also include dendrimers. For example, typical polymers are poly (p-phenylenevinylene) (PPV) derivatives, poly(p-phenylene) (PPP) derivatives, polyfluorene (PF) derivatives, poly(p-pyridine), poly(p-pyridalvinylene) derivatives, polythiophene derivatives, poly(thionene vinylene) derivatives, and polycarbazole derivatives. Typical oligomeric materials include oligo-PPV, oligo-PPP, oligo-PF, oligo-carbazole, and oligo-thiophene. Solution processed OLED materials can be a combination of more than one material. These materials can also be used in combination with one or more than one dopant.

Selective droplet deposition from a continuous stream of droplets can also be used for various stages in preparation of other types of displays and supporting films. For example, color filter arrays (CFAs) and other film structures can be fabricated using droplet deposition of suitable materials.

Barrier Coatings

It is a known problem that the penetration of oxygen and water into thin film display devices or other structures can severely degrade device lifetime. Unprotected, for example, a newly fabricated OLED device would last only minutes before its destruction by oxygen and by airborne moisture. LCDs must also be protected to prevent the formation of gas bubbles that degrade their performance. One method for preventing penetration by oxygen and moisture is to fabricate a sandwich structure using glass and glued metal on the outside, with the protected OLED or LCD material on the inside. However, such devices tend to be bulky, rigid, and costly and, in consequence, are incompatible with manufacturing goals for low cost display devices on flexible supports. Recent developments in barrier coatings suitable for flexible display include the use of a stacked structure of resin or polymer and ceramic layers. However, the manufacturing process for such composite structures can require a number of repeated stages, with multiple entry and reentry into vacuum deposition chambers in a process that is time consuming and costly.

Figure 10:
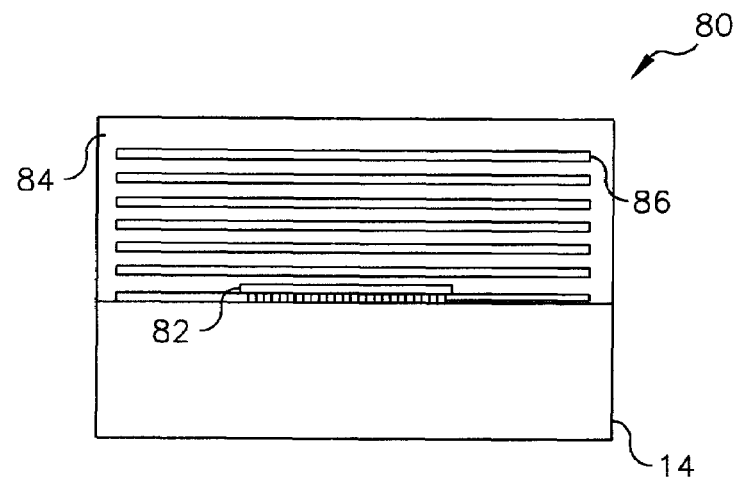
FIG. 10 shows a side view in cross-section of an OLED device having barrier coatings deposited according to the present invention.

Referring to the side view of FIG. 10, there is shown an OLED 80 having this type of barrier coating applied using selective droplet deposition from a continuous stream of droplets. An active OLED layer 82 is deposited on support 14 and is protected by a sandwiched arrangement of alternating polymer isolation layers 86 and ceramic layers 84, printed using a continuous ink jet print head. Examples of suitable polymer materials that can be deposited could include, but are not limited to, acrylate monomer, carbonate monomer, ester monomer, or urethane monomer which may be cured by application of heat or UV radiation or radiation of some other wavelength. Similarly polyacrylates, polycarbonates, polyurethanes, or polyester may be deposited, then cured by heat, UV radiation, or radiation of other wavelength with or without a cross-linking agent. Preferably, these materials would be transparent. Examples of ceramic materials that can be deposited would include, but not be limited to, liquid preparations containing Silicon oxide, titanium oxide, silicates, titanates, organic modified sol-gel precursor, sol-gel precursor, aluminum oxide, and other glass forming materials. Preferably, these materials would also be transparent.

Alternatively, printing droplets, non-printing droplets and/or satellite droplets can be cured before such droplets strike support 14, a gutter, and/or catching mechanism. Such curing can be achieved, for example, by exposing the droplets to a gas, heat, or energy before the droplets strike the support, gutter, and/or catching mechanism. It will be appreciated that where gas pressure is applied to deflect the droplets, the gas used to supply such pressure can be selected to perform the curing.

Deposition Materials and Supports

Suitable deposition materials for electronic device fabrication using selective droplet deposition from a continuous stream of droplets include, but are not limited to, the following:

(a) Conductive Polymers: polyaniline, polyacetylene, polythiophene, polypyrrole, indoles, furans, substituted phthalocyanines, stearic acid, trans-polyacetylene, PA, poly(para-phenylenevinylene), PPV, and poly(para-phenylene), PPP, etc.;

(b) Electrolytes and Electrolyte Separator: $LiBF_4$, poly (2-acrylamido-2-methylpropanesulfonic acid), etc.;

(c) Fluorescent Materials: Fluorescent dyed polyesters, fluorescent dyed polyethers, phosphors, ZnS:Ag, ZnS:Cu, Al, $Y_2O_2S$:Eu, $Y_2O_3$:Eu, ZnO:Zn, $ZnGa_2O_4$, $SrGa_2S_4$:Eu, $SrGa_2S_4$:Ce, $Y_3Al_5O_{12}$:Tb, $Y_2Si_5$:Tb, $YVO_4$, etc.;

(d) Insulators: ButylCycloButadiene (BCB), PMMA, polyamide, polyimide, polysilane, spin-on-glass, methylsilsesquioxane polymer, etc.;

(e) Metallic Colloids: Au, Pt, Ni, Cu, In, Sn, etc.;

(f) Metallic Pastes: Ag-dag, Au-dag, C-dag, particulate or chemically doped polymeric systems, cermets (polyimide-Cu, etc.), MOCVD-based particles, milled ceramics, milled crystals, milled thin films, heterogeneous gas phase generated particles, liquid-based particles etc.;

(g) Miscellaneous: Acid, alkali, fluorocarbon, $H_2O$, $H_2O_2$, HCl, Hydrocarbon, Iodine, Oxygen, Quinone, Solvents, stable orthorhombic phase crystal structure of the organic compound p-nitrophenyl nitronyl nitroxide (p-NPNN), Oligomers, Nitronyl nitroxides, Phenoxyl radicals, HNN (2-hydro NN), Biradical:m-BNN (m-Phenylenebis[nitronyl nitroxide]), foams, hybridised organic-inorganic system, phospholipids (including those containing a mol % of cholesterol), arachidic acid monolayer, etc.;

(h) Non-Wetting: Perfluorocarbons, etc.;

(i) Organo-metallics and Metallo-organics: Cu, Sn, In, hybridised organo-metallics and metallo-organics (Cu dispersed in an insulating matrix, etc.), tungsten oxide, nickel oxide, etc.;

(j) Organically-modified Ceramics (Ormocers) including Ormosils, siloxanes, silanes (TEOS—tetraethoxysilane);

(k) Polysilane compounds including modular silylenes;

(l) Protective Coatings: multifunctional acrylate, PMMA, Ormocers, silane compounds [TCS, BTCSE, TMCS, etc.] etc.;

(m) Semiconductors and light emitters: pentacenes, polyanilines, polythiophenes, polyacetylenes [including Durham pre-cursor route], PPV derivatives, (i.e., MEH-PPV: poly[2-methoxy-5-{2'-ethyl-hexyloxy}-1, 4-phenylene vinylene, [soluble in common organic solvents such as tetrahydrofuran [THF], chloroform, dichloromethane, etc.]), MEH-PPV blend, poly(arylenevinylenes), poly(3-alkylthiophenes), CN-PPV, PPV, PT, PPP, poly(phenylenes), poly(quinoxalines), poly (phenyleneacetylenes), fullerene and fulleride molecules, including but not limited to, $C_{70}$, $C_{76}$, $C_{78}$, $C_{82}$, $C_{84}$, and $C_{60}$-TDAE (tetrakis-dimethylamino ethylene), polyfluorene crystalline polymer, etc.;

(n) Sol-gel Compounds: $SnO_x$, ITO, PT, PZT, PLZT, tungsten oxide, $WO_3$, $TiO_2$, ZnO, $SnO_2$, $NiO_x$, $MnO_2$, Prussian blue, etc.; and (o) Polymer composites, including polymer materials supplemented with additive filler materials.

Materials deposited may be conductors, semiconductors, or dielectric substances, for example, or various materials used to form optical waveguides and other optical components including but not limited to prisms, light focusing structures, optical conductors, lenses, light blocking materials, and reflective structures.

Surface Preparation

Various additional processes could be employed for supporting selective droplet deposition from a continuous stream of droplets, including processes that pre-condition the support surface. This can include depositing a "subbing" layer onto the support, using droplet deposition or some other method. Subbing layer methods can include gravure, curtain, bead, slide, microgravure, and vacuum treatments.

A number of alternative methods could be employed for pre-treating the surface. Available methods include, but are not limited to, corona discharge, electrical charge application, magnetization, or chemical pre-treating. More elaborate surface preparation methods could include plasma discharge treatment, as is described in International Applications WO 00/65887 entitled "Method And Apparatuses For Plasma Treatment" by Bardos et al., and WO 00/63943 entitled "Large-Area Atmospheric-Pressure Plasma Jet" by Selwyn et al. Yet other surface modification methods include saponification baths, dielectric barrier discharge, flame treatment, and UV-ozone treatment, for example. Surface preconditioning can also include any number of cleaning treatments, using methods such as particle transfer rolls or cleaning baths. One comprehensive reference for surface treatments that may be suitable is *Modern Coating and Drying Technology*, edited by Edward D. Cohen and Edgar B. Gutoff, John Wiley & Sons, 1992.

Types of Droplet Deposition Apparatus Used

The apparatus and methods of the present invention may employ any of a number of types of mechanisms for selective droplet deposition from a continuous stream of droplets, including continuous flow ink jet print heads of either the electrostatic-deflection type (as disclosed in the Hertz '387 patent cited hereinabove), the micro-valve deflection type (as disclosed in the Lebens et al. '440 patent cited hereinabove) or the gas-flow deflection type. (as disclosed in the Hawkins et al. '197 patent cited hereinabove). As has been observed, the electrostatic-deflection type is suitable only where the deposited fluid has some conductivity; insulators must be treated in some way in order to allow their use with this type of continuous flow ink jet print head. The gas-flow deflection print head of the Hawkins '197 patent is particularly advantaged for high-speed web fabrication, handling fluids having any level of conductivity and allowing increased distance from the surface of the receiving support and a droplet frequency that is significantly higher than is available using other droplet deposition methods. The micro-valve deflection type print head would also be advantaged over the electrostatic deflection type for depositing non-conductive fluids.

For forming features onto a surface using selective droplet deposition from a continuous stream of droplets, it has been found that, unlike other droplet deposition methods which are hampered by poor resolution and low volume delivery, the height to width ratio of a feature formed in a single pass can be greater than 0.25. Single-pass feature formation is advantaged because it minimizes cross-sectional striations in the laydown material and, therefore, allows a more uniform density than does multiple-pass printing.

A high laydown density becomes possible with the use of the droplet deposition apparatus according to the present invention. Laydown densities in excess of 5 mg per square foot can be achieved. Furthermore, with the application of continuous ink jet technology, RMS deviation for height and width of features formed on support 14 can be maintained to within 1%. These measurable performance characteristics clearly distinguish selective droplet deposition from a continuous stream of droplets from other types of droplet deposition technologies conventionally used for flexible supports.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, the method and apparatus of the present invention flexibly allow a wide possible range of nozzle diameters and geometries for forming and directing a stream of sequential droplets. Various treatment methods can be used to supplement the materials deposition methods of the present invention. Additional cleaning or etching steps can be used to remove or dissolve unwanted satellite droplets 48 that have been deposited, as is shown in FIG. 11. For example, satellite drops 48 can be removed using laser ablation, washing, washing with a solvent and/or detergent, blowing with a pressurized gas or liquid, or applying a surface energy treatment prior to printing to reduce the adhesion of the satellite drop to the surface.

Selected embodiments of method and apparatus of the present invention advantageously form electronic circuit elements and optical components onto a moving support at higher throughput speeds than are conventionally available using the drop-on-demand print heads currently commercialized for component manufacture. Using an apparatus equipped with a continuous flow print head that provides selective droplet deposition from a continuous stream of droplets, the distance between the print head and the support can be increased over the tightly constrained distances permitted with the earlier drop-on-demand technology. Because additional space is available between the outlet of each print head apparatus and the support surface, a continuous flow ink jet print head can be more readily adapted for use with preconditioning components that may be deployed for treating the support surface or for conditioning ink jet droplets that are directed toward the surface for forming the circuit pattern. For example, heat, solvent vapor, conditioning vapor, light, or ultrasound energy could be applied to a droplet in trajectory from the nozzle to the surface, as well as just before droplet emission or following droplet deposition. While continuous flow ink jet print heads that are adapted according to the present invention provide a mechanism that is suitable for use with many types of fluids and environments, alternate types of mechanisms could be used for selecting and directing printing droplets from a continuous stream of droplets. Alternative mechanisms could use electrical, mechanical, acoustic, piezoelectric, or other transducers for generating a droplet stream, for example. Transport system 24 shown in FIGS. 2A, 2B, and 2C moves support 14 past stationary printheads 12, 13, 13a, 13b, and 13c. However, formation of features on support 14 could alternately be accomplished by moving one or more printheads 12, 13, 13a, 13b, and 13c relative to support 14. FIGS. 11-15 show top views of an article 130 of the invention and illustrate articles that can be formed in accordance with the invention. As shown in FIG. 11 an article 130 is provided having a single printed drop 56 on a support 132 of article 130. Printed drop 56 has a printed diameter of between 10 and 250 microns and has a radius R. As is shown in FIG. 11, not more than one satellite drop 48 is positioned within a radius of three times the radius R of printed drop 56. It will be appreciated that a satellite drop 48 can land at an edge 134 of printed drop 56 creating a bulge or protrusion that alters edge 134 can land within the edge 134 of printed drop 56, or can land outside of printed drop 56.

Figure 12:
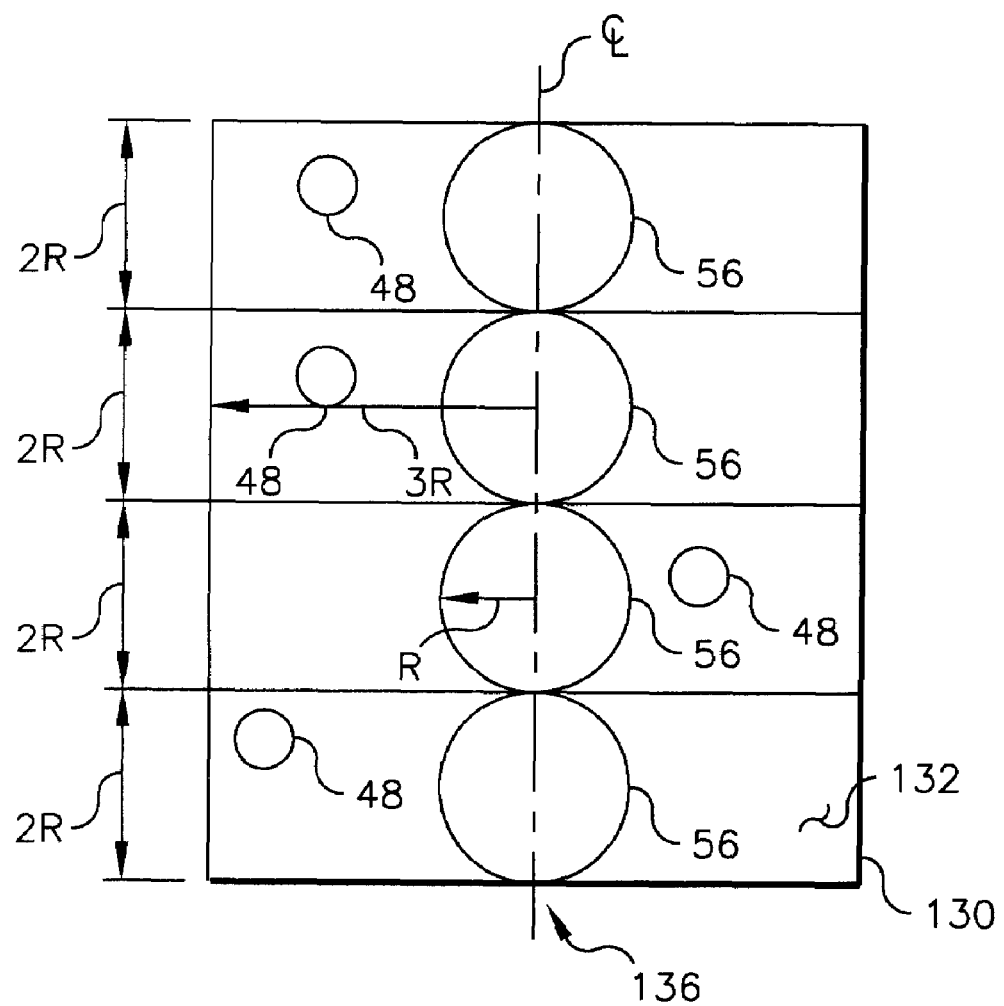
FIG. 12 shows a top view of section of another embodiment of an article having a linear pattern of printed droplets within an area also containing a satellite droplet.

FIG. 12 shows a top view of another embodiment of an article 130 of the invention. In this embodiment, a series of printed drops 56 is provided on support 132 of article 130 forming a line 136. In this embodiment, only one satellite drop 48 per printed drop 56 is within a range of 1 to 3 printed drop radii R of the centerline of line 136. Such a satellite drop 48 can land within printed drops 56, along an edge 134 of one of printed drops 56, or can land outside of printed drops 56.

Figure 13:
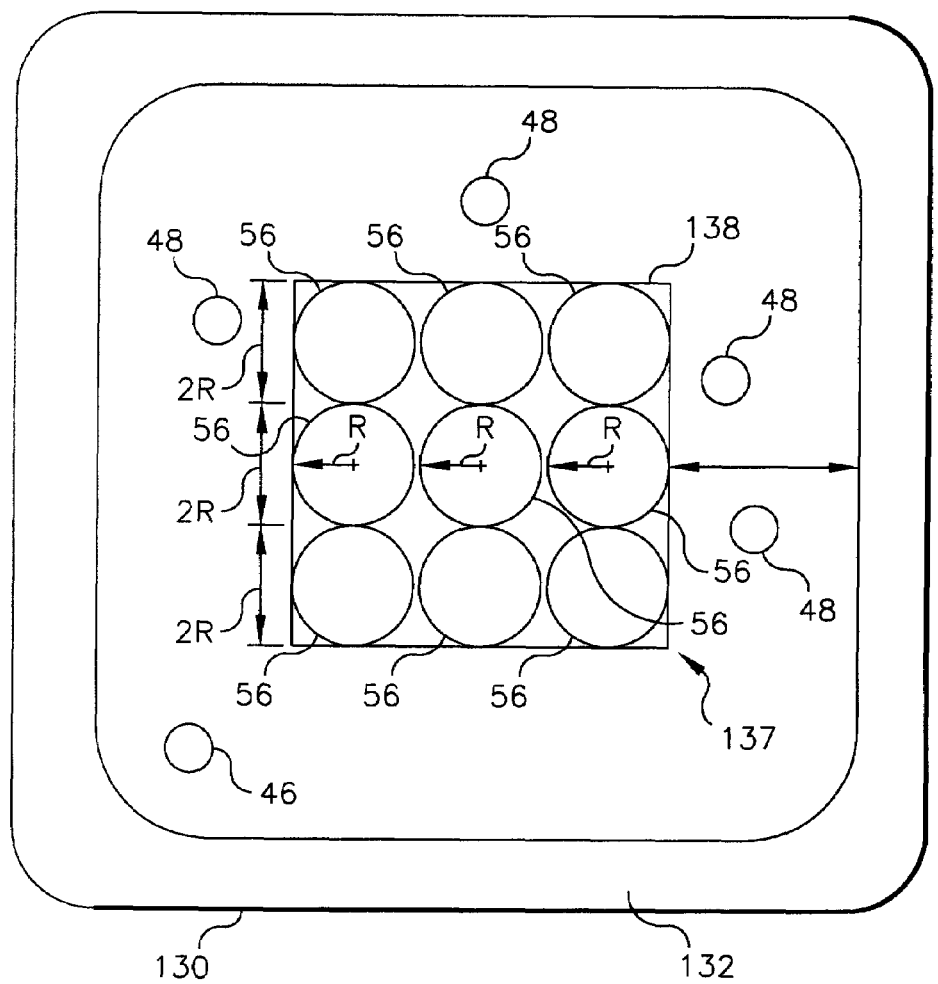
FIG. 13 shows a top view of a section of another embodiment of an article having a block pattern of printed droplet within an area also containing a satellite droplet.

FIG. 13 shows a top view of the article 130 of the invention. In this embodiment, multi-drop structure 137 is provided that is formed from individual printed droplets 56 defined on support 132 of article 130 to form a pattern of separated printed droplets 56. A satellite drop 48 can land within a 1 to 3 droplet radii of the center of any printing printed droplets 56 it will be appreciated that some of the 1 to 3 droplet radii areas overlap and therefore would result in more than one satellite droplets landing in any 1 to 3 radii zone. In certain embodiments, the number of satellite droplets 48 landing in any one to three radii zone is limited to n where n is the number of one to three radii zones from other printing droplets 56 that are within the same one to three radii zone.

It will be appreciated that, in practice, it may be possible for adjacent printed droplets to combine before solidifying and to lose droplet definition. In such a case, the radius described above as being a radius of the printed droplet can be, for the purposes of this invention, one half of the width of the narrowest portion of the structure formed on the article. Alternatively, a mass of material per unit area on support 132 can be used. In this alternative, a mass per unit area for the structure proximate to a satellite drop 48 is determined as X micrograms per squared micrometer. Once this is determined, the total mass of satellite drops deposited within a 250 micron range of the edge of the structure will typically be less than about 12.5% of the product (Xh) where h is the total area occupied by such satellite drops 48.

Figure 14:
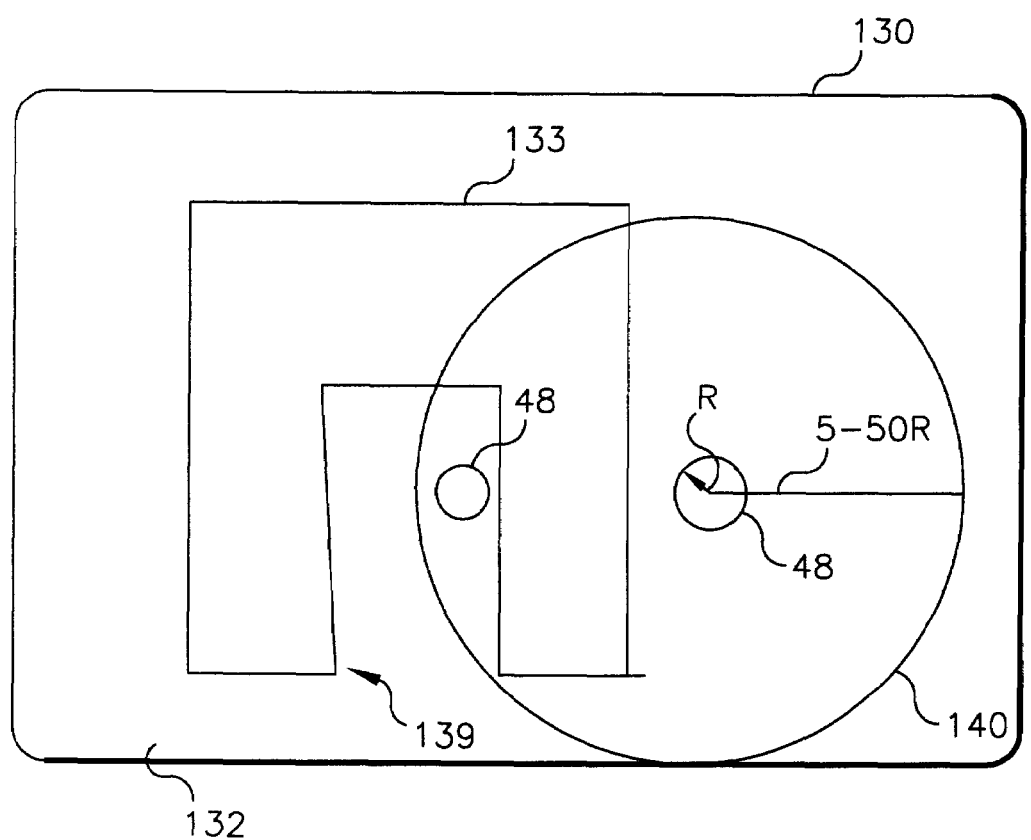
FIG. 14 shows a top view of a section of another embodiment of an article of the invention.

FIG. 14 shows another view of an article 130 having a support 132 with a structure 139 formed thereon from coalesced printed drops. Support 132 also has satellite drops 48. Because the printed drops have coalesced, it is difficult to determine the size of printed drops. However, a sectional length of a satellite drop 48 outside of structure 139 can easily be determined by measuring a length of satellite drop 48. In FIG. 14, satellite drop 48 is shown as being in a circular form thus, the sectional length can be measured as a radius R. In this embodiment, the total satellite drop material on support 132 within a radius of between 5 and 50R is limited to being less than about 50% of the total mass of structure 139 within this radius.

Figure 15:
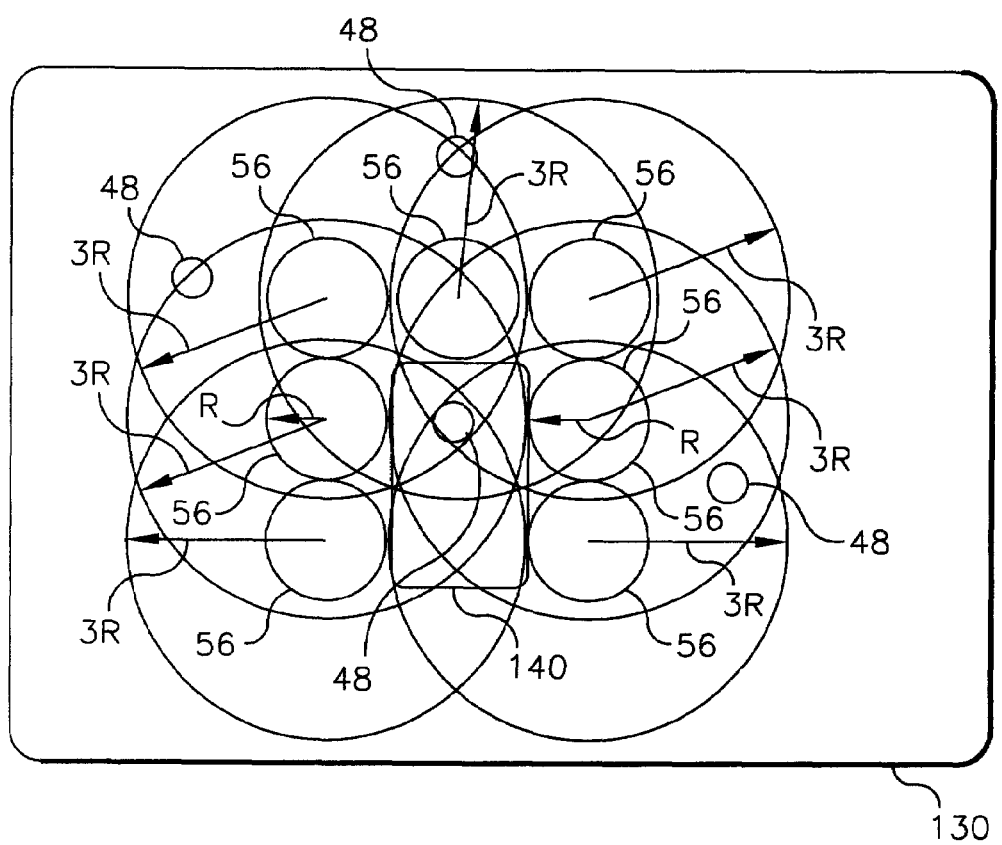
FIG. 15 shows still another top view of a section of another embodiment of an article of the invention.

Also shown in the embodiment of FIG. 15, is an area 140 between printed droplets 56 that is occupied by at least one satellite drop 48. In one embodiment of the invention, the percentage of area 140 occupied by satellite drop(s) 48 is no greater than 20% to 50% of area 140. In other embodiments, the mass of satellite droplets 48 located in area 140 is no greater than 50% of the mass of the printed droplets 56. In still other embodiments, the mass of satellite droplets 48 located in an area 140 is now between about 0.5 and 50% of the mass of the mean of the mass of the printed droplets. In some cases, it is not possible to accurately determine the mass of a printed droplet 56. In such cases the mass of satellite drops 48 should not exceed at least 20% of the mass of all structure within 375 microns of the satellite drop.

It will also be appreciated that while many of the examples provided herein describe an article formed from a single layer of material applied by a single pass of the support 130 though a printing apparatus of the invention, the method and apparatus of the invention can be applied repeatedly to a support 130 to build structures in successive layers.

Thus, what is provided is an apparatus and method for forming electronic, optical or other devices using selective droplet deposition from a continuous stream of droplets.

PARTS LIST

| | |
|---|---|
| 2 | substrate |
| 3 | conductor |
| 4 | layer of printed material |
| 5 | layer of printed material |
| 6 | layer of printed material |
| 7 | printed drop |
| 8 | satellite drop |
| 9 | satellite drop |
| 10. | printing apparatus |
| 11. | fabrication apparatus |
| 12. | continuous ink jet print head |
| 13. | continuous ink jet print head |
| 13a-13c. | continuous ink jet print head |
| 14. | support |
| 15. | transport surface |
| 16. | pattern source |
| 17. | fluid gutter |
| 18. | pattern processing unit |
| 19. | fluid recycling unit |
| 20. | heater control circuit |
| 22. | nozzle heater |
| 24. | support transport system |
| 26. | transport control system |
| 28. | micro-controller |
| 30. | fluid reservoir |
| 30a-30c. | fluid reservoir |
| 32. | fluid pressure regulator |
| 34. | droplet conditioning device |
| 36. | stream |
| 38. | droplet |
| 39. | deflected drop |
| 40. | electrode |
| 42. | gutter |
| 43. | non-deflected drop |
| 44. | nozzle |
| 46. | flow |
| 48. | satellite droplet |
| 50. | print head |
| 51. | fluid |
| 52. | nozzle |
| 54. | heater |
| 56. | printed droplet |
| 58. | non-printed droplet |
| 60. | flow |
| 62. | force |
| 64. | fluid supply |
| 66. | collection vessel |
| 67. | diverted fluid droplets |
| 68. | control surface |
| 69. | reconstitution vessel |
| 70. | patterning mask |
| 70'. | patterning mask |
| 72. | coating |
| 74. | portion |
| 76. | depression |
| 78. | satellite droplet guttering system |
| 80. | OLED |
| 82. | OLED layer |
| 84. | ceramic layer |
| 86. | isolation layer |
| 90. | transistor |
| 92. | support |
| 94. | gate region |
| 96. | spacer |
| 98. | gate insulator |
| 100. | source region |
| 102. | drain region |
| 104. | active semiconductor region |
| 106. | protective layer |
| 108. | interface layer |
| 110. | display pixel |
| 112. | support |
| 114. | layer |
| 115. | gate |
| 116. | insulator |
| 118. | electro-luminescent region |
| 120. | top contact |

-continued

PARTS LIST

| | |
|---|---|
| 122. | transistor |
| 130. | article |
| 132. | support |
| 133. | structure |
| 134. | edge |
| 136. | line |
| 137. | multi-drop structure |
| 138. | edge |
| 139. | structure |
| 140. | area |

The invention claimed is:

1. A method for depositing a material on a surface, the method comprising the steps of:
 forming a stream of a component material having formed printing and non-printing droplets and satellite droplets of the material, the stream directed at the surface; and
 applying a deflecting energy to separate printing droplets from non-printing droplets in the stream, so that only printing droplets travel to the surface: the deflecting energy being adapted to direct non-printing droplets for non-printing drop collection, and to direct at least a portion of the satellite droplets to be controlled in a manner adapted to prevent the material in the satellite droplets from reaching the surface, so that less than all of the material in the satellite droplets reaches the surface.

2. The method of claim 1, wherein the step of forming a stream comprises the steps of:
 ejecting the component material through one of said nozzles under pressure; and
 applying an energy to the component material adapted to cause break up of the ejected material into the formed printing and non-printing droplets.

3. The method of claim 1, wherein said collection comprises recycling at least some of the material from non-printing droplets into the stream.

4. The method of claim 1, further comprising the step of recycling at least some of the material from the satellite droplets into the stream.

5. The method of claim 1, wherein the step of applying a deflecting energy comprises applying a deflecting energy with an intensity that is sufficient to deflect non-recyclable satellite material for collection and to deflect recyclable satellite droplets and non-printing drops to be recycled.

6. The method of claim 1, wherein the satellite drops are deflected to a shield surface.

7. The method of claim 6, wherein the shield surface is adapted to absorb the satellite drops.

8. The method of claim 1, wherein the step of applying a deflecting energy comprises the step of applying a gas pressure differential to the droplets.

9. The method of claim 1, wherein the step of applying a deflecting energy comprises the step of applying a gas pressure differential to the droplets, said gas being adapted to condition the droplets.

10. The method of claim 1, wherein the drops are conditioned or cured before striking the support.

11. The method of claim 1, wherein the step of deflecting energy comprises applying at least one of an electrical field and a magnetic field to the stream to deflect the drops.

12. The method of claim 1, wherein the structure farmed by the deposited material comprises at least one of a component of an electroluminescent diode, a transistor, a conductor, a resistor, a diode, an optical circuit, an electrical circuit, a fluidic circuit, an opto-electronic device, or an electro-mechanical device.

13. The method of claim 1, wherein the surface formed at least in part from at least one of a polyethylene-terephthalate, Polyethylene-napthalate, cellulose acetate, metal foil, titanium, aluminum, titanium alloy, aluminum alloy, paper, stainless steel, Polyvinyl-chloride, polycarbonate, polyimides, glass, woven fabric, filled polymers, thermoplastics, voided supports, foams, and felt.

14. A method of claim 1, wherein the material is formed, at least in part from, carbon black, polyaniline compounds, polyacetylene compounds, polythiophene compounds, polypyrrole compounds, polysilane compounds. stearic acid, substituted phthalocyanines, indoles, furans, cis- and trans-polyacetylene, polypara-phenylenevinylene, polyparaphenylene, polydiacetylenes, polypithiophenes, polyisothianapthene, polyphenylenesulfide, polythienylvinylenes, polyphenylenevinylenes, EDOT (3,4-ethylenedioxythiophene), PEDOT (polyethylenethioxythiophene), fluids containing particles, metals, semiconductors, conductors, insulators, a glass, a photosensitive material, a radiation sensitive material, a solvent sensitive material, and a heat sensitive material.

15. The method of claim 14, wherein said particles include nano-sized particles, liquid emulsions, colloids, sol-gels, metals.

16. A method of claim 1, wherein the material comprises a hydrophobic material.

17. A method of claim 1, wherein the material comprises a hydrophilic material.

18. A method of claim 1, wherein the material is at least one of an electrical conductor, a semiconductor, a dielectric or a combination thereof.

19. A method of claim 1, wherein the material is one of an optical conductor, an optical component, a reflective material, a prism, a light focusing structure and a light blocking material.

20. The method of claim 1, further comprising step of translating the nozzles and surface relative to each other while selectively ejecting material from the nozzles so as to form a pattern of material on the surface.

21. The method of claim 1, further comprising the step of treating the surface to remove deposited satellite droplets.

22. The method of claim 21, wherein treatment may be laser ablation, washing, surface energy treatment, blowing.

23. The method of claim 1, wherein for each printed droplet there is, on average, no more than one deposited satellite droplet within a distance of between one and three times the radius of the deposited print droplet horn its center.

24. The method of claim 1, wherein less than half of the satellite droplets reach the surface.

25. The method of claim 1, wherein more than 75% of the material in the satellite drops does not reach the surface.

26. The method of claim 1, wherein the satellite drops have less mass than the printing and non-printing drops.

27. The method of claim 1, wherein the printing drops are adapted to form patterns on the surface having a separation with the satellite drops being controlled so that between about 10% and 35% of the area between adjacent printing drops is filled with material from satellite drops.

28. The method of claim 1, wherein selected ones of the nozzles are adapted to apply a conditioning material to the surface to adapt the surface to receive other material applied by the nozzles.

29. The method of claim 1, further comprising the step of conditioning the surface with a plasma or electromagnetic discharge, a flow?, a chemical, a UV-ozone treatment, a particle transfer roller or a cleaning bath.

30. The method of claim 1, further comprising the step of directing streams from different nozzles so that printing drops from more than one stream meet at a common point on the surface.

31. The method of claim 1, wherein the material has a viscosity of greater than 5 centipoise.

32. A method for forming a pattern on a surface of a flexible support, the method comprising the steps of:
providing relative translation of the surface and an array of nozzles;
depositing a plurality of materials onto the support according to a pattern, each material deposited from an array of fluidic nozzles, with the following steps occurring at each nozzle:
forming a stream comprising a series of fluidic droplets of one of the materials, the stream directed at the surface;
applying a deflecting energy to separate droplets in the stream, so that only selected droplets travel to the surface;
diverting the deflected non-selected droplets away from the surface toward a guttering mechanism; and
controlling at least a portion of the deflected fluid droplets so that the component can be formed from the pattern of material deposited thereon by the printing drops with reduced satellite material thereabout.

33. The method of claim 32, wherein a first group of the array of nozzles forms a stream of a first one of the materials and a second group of the array of nozzles forms a stream of a second one of the materials, and wherein the surface and the array of nozzles are actuated so that patterns of the first material and the second material can be combined.

34. The method of claim 32, wherein a first group of the array of nozzles forms a stream of a first one of the materials and a second group of the array of nozzles forms a stream of a second one of the materials, and wherein the direction of individual ones of the first group and second group of nozzles can be modified to direct materials to form material combinations on the surface.

35. The method of claim 32, wherein at least one of the materials comprises a precursor material that is applied to the support by the nozzles.

36. The method of claim 35, wherein the pattern is formed on the surface by a combination of the precursor material and a second material.

37. The method of claim 35, wherein the precursor pattern reacts to the application of energy to change to a preferred condition and further comprising the step of applying an energy to cause the precursor material to react.

38. The method of claim 32, wherein the pattern formed on the support includes an arrangement of electrical conductors and a resistive material.

39. The method of claim 32, wherein the pattern formed on the support includes at least one element of the set consisting of an electrode, a hole injection layer, a hole transport layer, an electron transport layer, an electron injection layer, a base contact layer, and a protective coating.

40. The method of claim 32, wherein the pattern formed on the support includes an arrangement of materials to form a light emitting diode.

41. The method of claim 40, further comprising the step of forming a drive component for the light-emitting diode on the surface.

42. The method of claim 41, wherein the drive component comprises a drive transistor.

43. The method of claim 41, wherein the light-emitting diode is driven by a passive matrix array.

44. The method of claim 41, wherein the light-emitting diode is driven by an active matrix array.

45. The method of claim 40, wherein the light emitting diode is driven by a direct drive means.

46. A method of forming a pattern of a first material on a surface, the method comprising the steps of:
depositing a coating of the first material onto at least one portion of the surface;
depositing a patterning mask onto the coating from a mask pattern material, wherein the patterning mask is deposited from an array of fluidic nozzles, wherein material is ejected from each nozzle in accordance with the steps of;
forming a stream of a component material having formed printing and non-printing droplets and satellite droplets of the material, the stream directed at the surface;
applying a deflecting energy to separate printing droplets from non-printing droplets in the stream, so that only printing droplets travel to the surface; and
with the deflecting energy being adapted to direct non-printing droplets for non-printing drop collection; and to direct at least a portion of the satellite droplets to be controlled in a manner adapted to prevent at least some material in the satellite droplets from reaching the surface, and,
providing relative translation of the array of fluidic nozzles and the surface.

47. The method of claim 46, wherein the step of forming a stream comprises the steps of:
ejecting patterning mask material through a print nozzle under pressure; and
applying an energy to the patterning mask material to cause break up of the ejected material into the stream of fluidic droplets.

48. The method of claim 46, further comprising applying an exposure energy to the surface to condition the coating according to the patterning mask.

49. The method of claim 46, wherein the patterning mask material chemically conditions the coating.

50. The method of claim 46, wherein the patterning mask conditions the conductivity of the coating.

51. The method of claim 46, wherein the patterning mask enhances conductivity of the coating.

52. The method of claim 46, wherein the coating comprises a colloid.

53. The method of claim 46, wherein the coating comprises a metallic ink.

54. The method of claim 46, wherein the coating comprises at least in part, one of a polyaniline, polythiophene, organically modified ceramic, organically modified silicate, sol-gel, carbon black, polyaniline compounds, polyacetylene compounds, polythiophene compounds, polypyrrole compounds, polysilane compounds, stearic acid, substituted phthalocyanines, indoles, furans, polypara-phenylenevinylene, polyparaphenylene, polydiacetylenes, polybithiophenes, polyisothianapthene, polyphenylenesulfide, polythienylvinylenes, EDOT, PEDOT, fluids containing particles, metals, semiconductors, conductors, insulators, and glass.

55. The method of claim 46, wherein the patterning mask material is taken from the group consisting of a photosensitive material, a radiation-sensitive material, a solvent sensitive material, and a heat sensitive material.

56. The method of claim 46, wherein the first material is substantially transparent.

57. The method of claim 46, further comprising the step ot preconditioning the surface or the coating.

58. The method of claim 57, wherein the step of preconditioning comprises the step of treating the surface using magnetization.

59. A method for forming a channel pattern on a surface comprising:
- depositing printing droplets on the surface to form relief structures on the surface in a channel pattern, by performing the following steps using a plurality of nozzles;
- forming a stream of fluidic droplets of the material, the stream directed at the surface;
- applying a deflecting energy to separate printing droplets from non-printing droplets in the stream, thereby directing printing droplets toward the surface;
- diverting non-printing droplets away from the surface toward a guttering mechanism;
- controlling at least a portion of satellite droplets in the stream from the surface so that they do not reach the surface; and
- transporting the surface with respect to the array of fluidic nozzles.

60. The method of claim 59, further comprising the steps of solidifying the relief structures and depositing a fluid to fill at least a part of the channel pattern.

61. The method of claim 59, wherein the relief structure material comprises a hydrophobic material.

62. The method of claim 59, wherein the relief structure material comprises a hydrophilic material.

63. The method of claim 59, wherein the relief structure comprises a pattern of walls raised from the surface.

64. The method of claim 59, wherein the relief structure is at least one of an electrical conductor, a semiconductor, a dielectric or a combination thereof.

65. The method of claim 64, wherein the relief structure has a conductivity of less than 500 microsiemens/cm.

66. The method of claim 59, wherein the relief structure is one of an optical component, an optical conductor, a reflective material, a prism, a light focusing structure and a light blocking material.

67. The method of claim 59, wherein the channel is coated with at least one material to form a structure in the channel.

68. A method for forming a barrier coating for an electroluminescent component formed on a surface, the method comprising the steps of:
- (a) forming at least one polymer isolation layer by performing the following steps at each of a plurality of fluidic nozzles;
  - (i) forming a first stream comprising a series of fluidic droplets of isolation layer material, the stream directed substantially to the surface;
  - (ii) selectively steering a plurality of individual droplets from the series of droplets of the first stream onto the surface; and
  - (iii) selectively steering any non-printing drops and any satellite drops from the first stream so that less than all of the material from the satellite drops reaches the surface;
- (b) forming at least one ceramic layer by performing the following steps at each of a plurality of fluidic nozzles:
  - (i) forming a second stream comprising a series of fluidic droplets of ceramic layer material, the stream substantially directed to the surface;
  - (ii) selectively steering a plurality of individual droplets from the series of droplets in the second stream onto the surface; and
  - (iii) selectively steering any non-printing drops and any satellite drops from the second stream so that less than all of the material from the satellite drops reaches the surface, while transporting the surface past and plurality of fluidic nozzles, in a single direction.

69. A method for forming a structure on a support, the method comprising the steps of:
- providing a stream of a component material having at least some printing droplets and non-printing droplets; and
- applying a deflecting energy adapted to allow printing droplets to travel to the support, while ensuring that non-printing droplets and any other material in the stream of component material travel to a receiving area that is separate from a source of the deflecting energy, so that the non-printing droplets and any satellite material emitted during the provision of the stream of component material do not interfere with the ability of the source to generate the deflecting energy.

70. The method of claim 69, wherein the receiving area comprises a gutter to collect non-printing droplets and a control surface to intercept the satellite material.

71. The method of claim 69, further the wherein the step of applying a deflecting energy comprises applying a deflecting energy with an intensity that is sufficient to deflect non-recyclable satellite drops for collection and to deflect recyclable satellite drops for other collection.

72. The method of claim 69, wherein the step of forming a stream of component material comprises the steps of:
- delivering the material through a print nozzle under a generally continuous pressure; and
- applying an energy to the material to cause the delivered material to break up into the stream of printing and non-printing droplets.

73. The method of claim 69, wherein the step of forming a stream of component material comprises applying a gas pressure differential to the stream of component material.

74. The method of claim 69, wherein the structure formed by the material comprises at least one of a component of an electroluminescent element, light emitting diode, an organic light emitting diode, a polymeric light emitting diode, a transistor, a conductor, a resistor, a diode, an optical circuit, an electrical circuit, a fluidic circuit, an opto-electronic device, or an electro-mechanical device.

75. A method for forming a feature on the surface of a flexible support, the method comprising the steps of:
- (a) transporting the support past a print mechanism at a rate in excess of 0.5 inches per second;
- (b) depositing a material from the print mechanism onto the moving support in droplet form, with the steps of;
  - (i) forming a stream of fluidic droplets of the material, the stream directed at the support surface;
  - (ii) applying a deflecting energy to separate printing droplets from nonprinting droplets in the stream, to direct printing droplets toward the surface; and
  - (iii) diverting non-printing droplets away from the surface toward a guttering mechanism and collecting at least a portion of the satellite droplets so that material from the satellite droplets does not reach the surface.

* * * * *

UNITED STATES PATENT AND TRADEMARK OFFICE
CERTIFICATE OF CORRECTION

PATENT NO. : 7,288,469 B2
APPLICATION NO. : 11/003822
DATED : October 30, 2007
INVENTOR(S) : Ravi Sharma et al.

It is certified that error appears in the above-identified patent and that said Letters Patent is hereby corrected as shown below:

| | |
|---|---|
| Column 35, Line 65 | In Claim 12, delete "farmed" and insert -- formed --, therefor. |
| Column 36, Line 17 | In Claim 14, delete "polypithiophenes," and insert -- polybithiophenes, --, therefor. |
| Column 36, Line 50 | In Claim 23, delete "horn" and insert -- from --, therefor. |
| Column 37, Line 1 | In Claim 29, delete "flow?" and insert -- flow -- |
| Column 40, Line 26 | In Claim 71, after "further" delete "the" |

Signed and Sealed this

Third Day of June, 2008

JON W. DUDAS
*Director of the United States Patent and Trademark Office*